United States Patent
Park et al.

(10) Patent No.: US 10,932,376 B2
(45) Date of Patent: Feb. 23, 2021

(54) DISPLAY DEVICE

(71) Applicant: Samsung Display Co., Ltd., Yongin-Si (KR)

(72) Inventors: Dongjin Park, Seongnam-si (KR); Hansun Ryou, Seoul (KR); Dongwoo Seo, Suwon-si (KR); Jaiku Shin, Hwaseong-si (KR); Sungchul Choi, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 16/715,250

(22) Filed: Dec. 16, 2019

(65) Prior Publication Data

US 2020/0260596 A1     Aug. 13, 2020

(30) Foreign Application Priority Data

Feb. 8, 2019  (KR) ........................ 10-2019-0014984

(51) Int. Cl.
*H05K 5/00* (2006.01)
*H05K 5/03* (2006.01)
(Continued)

(52) U.S. Cl.
CPC ............. *H05K 5/0017* (2013.01); *B32B 7/12* (2013.01); *H01L 51/0097* (2013.01); *H01L 51/5246* (2013.01); *H05K 5/03* (2013.01); *B32B 2457/206* (2013.01); *B32B 2457/208* (2013.01); *H01L 27/323* (2013.01); *H01L 2251/5338* (2013.01)

(58) Field of Classification Search
CPC .... H05K 5/0017; H05K 5/03; H01L 51/0097; H01L 51/5246; H01L 2251/5338; H01L 27/323; H01L 51/5253; B32B 7/12; B32B 2457/208; B32B 2457/206; G06F 1/1652
See application file for complete search history.

(56) References Cited

U.S. PATENT DOCUMENTS

2016/0209874 A1*  7/2016  Choi ................. H05K 1/028
2018/0151644 A1   5/2018  Han et al.
(Continued)

FOREIGN PATENT DOCUMENTS

KR    1020180036323 A    4/2018
KR    1020180059645 A    6/2018
(Continued)

*Primary Examiner* — Abhishek M Rathod
(74) *Attorney, Agent, or Firm* — Cantor Colburn LLP

(57) ABSTRACT

A display device includes a display module and a cover member disposed below the display module. The cover member includes a first upper plate disposed below the display module, a second upper plate disposed below the display module and spaced a first distance apart from the first upper plate in a first direction, a first attachment layer attached to a bottom surface of the first upper plate, a second attachment layer attached to a bottom surface of the second upper plate and spaced a second distance, which is greater than the first distance, apart from the first attachment layer in the first direction, a first lower plate attached to a bottom surface of the first attachment layer, and a second lower plate attached to a bottom surface of the second attachment layer.

20 Claims, 16 Drawing Sheets

(51) Int. Cl.
    *H01L 51/00*     (2006.01)
    *H01L 51/52*     (2006.01)
    *B32B 7/12*     (2006.01)
    *H01L 27/32*     (2006.01)

(56) References Cited

U.S. PATENT DOCUMENTS

| | | | |
|---|---|---|---|
| 2018/0192527 A1 | 7/2018 | Yun et al. | |
| 2018/0295735 A1 | 10/2018 | Ahn | |
| 2018/0343756 A1* | 11/2018 | Lin | B32B 3/26 |
| 2020/0019212 A1* | 1/2020 | Jung | G06F 1/1641 |
| 2020/0022267 A1* | 1/2020 | Han | H05K 5/03 |
| 2020/0209998 A1* | 7/2020 | Shin | G06F 1/1641 |

FOREIGN PATENT DOCUMENTS

| | | |
|---|---|---|
| KR | 1020180079016 A | 7/2018 |
| KR | 1020180114565 A | 10/2018 |

\* cited by examiner

DISPLAY DEVICE

This application claims priority to Korean Patent Application No. 10-2019-0014984, filed on Feb. 8, 2019, and all the benefits accruing therefrom under 35 U.S.C. § 119, the content of which in its entirety is herein incorporated by reference.

BACKGROUND

1. Field

The disclosure herein relates to a display device with improved product reliability.

2. Description of the Related Art

A display device displays various images on a display screen to provide information to a user. In general, the display device displays information on a assigned screen. In recent years, flexible display devices including a foldable flexible display panel have been developed. Such flexible display devices may be folded, rolled, or bent unlike a rigid display device. Since the flexible display device, which is variously changeable in shape, may be carried with a shape or size regardless of a typical screen size, convenience of a user may improve.

SUMMARY

The disclosure provides a display device having improved product reliability.

An embodiment of the invention provides a display device including: a display module; and a cover member disposed below the display module. In such an embodiment, the cover member includes: a first upper plate disposed below the display module; a second upper plate disposed below the display module and spaced a first distance apart from the first upper plate in a first direction; a first attachment layer attached to a bottom surface of the first upper plate; a second attachment layer attached to a bottom surface of the second upper plate and spaced a second distance, which is greater than the first distance, apart from the first attachment layer in the first direction; a first lower plate attached to a bottom surface of the first attachment layer; and a second lower plate attached to a bottom surface of the second attachment layer.

In an embodiment, the second distance may be in a range from about 10 millimeters (mm) to about 34 mm.

In an embodiment, the display module may include a first non-folding area, a folding area and a second non-folding area, which are sequentially defined in the first direction, and each of the first attachment layer and the second attachment layer may not overlap the folding area on a plane.

In an embodiment, a first end of the first attachment layer may overlap the first non-folding area while being spaced apart from a boundary between the first non-folding area and the folding area on the plane, and a second end of the second attachment layer may overlap the second non-folding area while being spaced apart from a boundary between the second non-folding area and the folding area on the plane.

In an embodiment, the cover member may include: a first intermediate adhesive layer disposed between the display module and the first upper plate and attached to the first upper plate; a first step compensation layer disposed between the display module and the first upper plate; a second intermediate adhesive layer disposed between the display module and the second upper plate and attached to the second upper plate; and a second step compensation layer disposed between the display module and the second upper plate.

In an embodiment, both opposing surfaces of each of the first intermediate adhesive layer and the second intermediate adhesive layer may have an adhesive force, and each of the first step compensation layer and the second step compensation layer may have a surface having an adhesive force less than an adhesive force of an opposing surface thereof.

In an embodiment, the first intermediate adhesive layer may overlap the first non-folding area on the plane, the second intermediate adhesive layer may overlap the second non-folding area on the plane, and each of the first step compensation layer and the second step compensation layer may overlap the folding area on the plane.

In an embodiment, the first intermediate adhesive layer may have a width in the first direction, which is greater than the second width, and the second intermediate adhesive layer may have a width in the first direction, which is greater than a width of the second attachment layer in the first direction.

In an embodiment, the cover member may further include: a protection layer disposed below the display module; and a cushion layer disposed below the protection layer. In such an embodiment, the first intermediate adhesive layer may be attached to the cushion layer, and the second intermediate adhesive layer may adhere to the cushion layer.

In an embodiment, the display module comprises a first non-folding area, a folding area, and a second non-folding area, which are sequentially defined in the first direction, and the cover member may further include an intermediate adhesive layer disposed between the display module and the first upper plate and between the display module and the second upper plate. In such an embodiment, the first upper plate may be attached to the intermediate adhesive layer in an area overlapping the first non-folding area on a plane, the second upper plate may be attached to the intermediate adhesive layer in an area overlapping the second non-folding area on the plane, and the first upper plate and the second upper plate may not be attached to the intermediate adhesive layer in an area overlapping the folding area on the plane.

In an embodiment, each of the first attachment layer and the second attachment layer may be a pressure sensitive adhesive.

In an embodiment, each of the first upper plate, the second upper plate, the first lower plate, and the second lower plate may be a metal plate.

In an embodiment, the first upper plate may have a first width in the first direction, which is greater than a second width of the first attachment layer in the first direction, and the second upper plate may have a third width in the first direction, which is greater than a fourth width of the second attachment layer in the first direction.

In an embodiment, the first lower plate may have a fifth width in the first direction, which is the same as the first width, and the second lower plate may have a sixth width in the first direction, which is the same as the third width.

In an embodiment of the invention, a display device includes: a display module including a first non-folding area, a folding area, and a second non-folding area, which are sequentially defined in a first direction; and a cover member disposed below the display module. In such an embodiment, the cover member includes: a first upper plate disposed below the first non-folding area; a second upper plate disposed below the second non-folding area; a first lower plate disposed below the first upper plate; a second lower plate disposed below the second upper plate; a first attachment layer disposed between the first upper plate and the first lower plate; and a second attachment layer disposed between the second upper plate and the second lower plate. In such an embodiment, the first upper plate has a width in the first direction, which is greater than a width of the first attachment layer in the first direction, and the second upper plate has a width in the first direction, which is greater than a width of the second attachment layer in the first direction.

In an embodiment, a center in the first direction may be defined in the folding area, a distance from the center to a first end of the first attachment layer may be in a range from about 5 mm to about 17 mm, and a distance from the center to a second end of the second attachment layer may be in the range from about 5 mm to about 17 mm.

In an embodiment, the width of the first attachment layer in the first direction may correspond to a distance from the first end to a third end, which is disposed opposite to the first end, of the first attachment layer, and the third end may overlap an end of the first upper plate on a plane.

In an embodiment, each of the first attachment layer and the second attachment layer may be a pressure sensitive adhesive.

In an embodiment, the cover member may further include: a first intermediate adhesive layer disposed between the display module and the first upper plate while being attached to the first upper plate; a first step compensation layer disposed between the display module and the first upper plate; a second intermediate adhesive layer disposed between the display module and the second upper plate while being attached to the second upper plate; and a second step compensation layer disposed between the display module and the second upper plate. In such an embodiment, the first intermediate adhesive layer may overlap the first non-folding area on a plane, the second intermediate adhesive layer may overlap the second non-folding area on the plane, and each of the first step compensation layer and the second step compensation layer may overlap the folding area on the plane.

In an embodiment, both opposing surfaces of each of the first intermediate adhesive layer and the second intermediate adhesive layer may have an adhesive force, and each of the first step compensation layer and the second step compensation layer may have a surface having an adhesive force less than an adhesive force of an opposing surface thereof.

BRIEF DESCRIPTION OF THE FIGURES

The above and other features of the invention will become apparent by describing in detail exemplary embodiments thereof with reference to the accompanying drawings, in which.

DETAILED DESCRIPTION

Figure 1A:
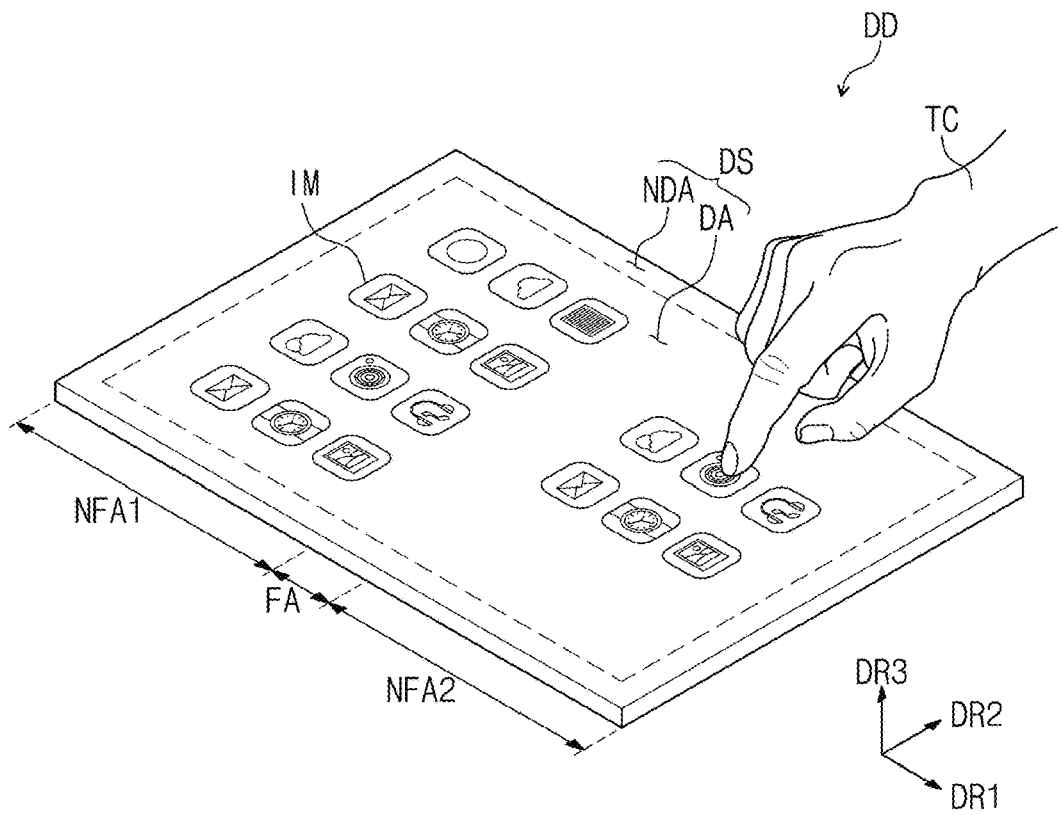
FIG. 1A is a perspective view illustrating a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one of A and B" means "A or B." "Or" means "and/or." As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Also, ""under", "below", "above', "upper", and the like are used for explaining relation association of components illustrated in the drawings. The terms may be a relative concept and described based on directions expressed in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

Figure 1B:
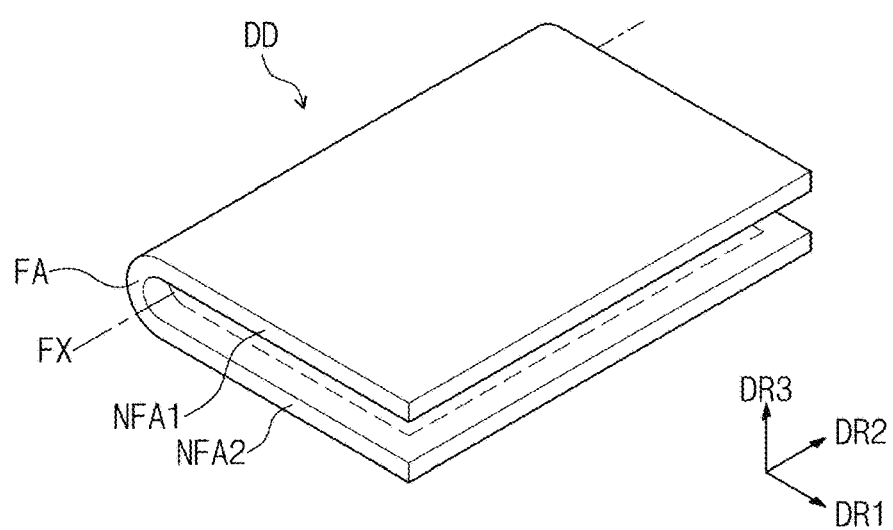
FIG. 1B is a view illustrating the display device of FIG. 1A in a folded state.

FIG. 1A is a perspective view illustrating a display device according to an embodiment of the invention. FIG. 1B is a view illustrating the display device of FIG. 1A in a folded state.

Referring to FIGS. 1A and 1B, an embodiment of a display device DD may be a foldable display device. Such an embodiment of the display device DD may be used for large-sized electronic devices such as televisions and monitors and small and medium-sized electronic devices such as mobile phones, tablet personal computers ("PC"s), navigation units for vehicles, game consoles, and smart watches.

In an embodiment, the display device DD may have a top surface on which a display surface DS is defined, and the display surface DS in an unfolded state may on a plane defined by a first direction DR1 and a second direction DR2.

The display surface DS may include a display area DA and a non-display area NDA disposed around the display area DA. The display area DA is an area on which an image IM is displayed, and the non-display area NDA is an area on which the image IM is not displayed. In an embodiment, as shown in FIG. 1A, the image IM displayed on the display area DA may include application icons.

The display area DA may have a rectangular shape. The non-display area NDA may surround the display area DA. However, the embodiment of the invention is not limited to the shape of the display area DA and the non-display area NDA as disclosed. In such an embodiment, the shapes of the display area DA and the non-display area NDA may be variously modified or relatively designed.

In an embodiment, a first non-folding area NFA1, a folding area FA, and a second non-folding area NFA2 may be sequentially defined on the display device DD in the first direction DR1. In such an embodiment, the folding area FA may be between the first non-folding area NFA1 and the second non-folding area NFA2. In an embodiment, one folding area FA and the first and second non-folding areas NFA1 and NFA2 are defined as illustrated in FIGS. 1A and 1B, but the embodiment of the invention is not limited to the number of the folding area FA and the first and second non-folding areas NFA1 and NFA2 as disclosed. In such an embodiment, the display device DD may include two or more non-folding areas and folding areas disposed between the non-folding areas.

In an embodiment, the display device DD may be folded with respect to a folding axis FX. In such an embodiment, the folding area FA may be bent with respect to the folding axis FX. The folding axis FX may extend in the second direction DR2. The folding axis FX may be defined as a minor axis that is parallel to a short side of the display device DD.

When the display device DD is folded, a display surface of the first non-folding area NFA1 and a display surface of the second non-folding area NFA2 may face each other. Thus, the display surface DS in the folded state may not be exposed to an outside.

Figure 2A:
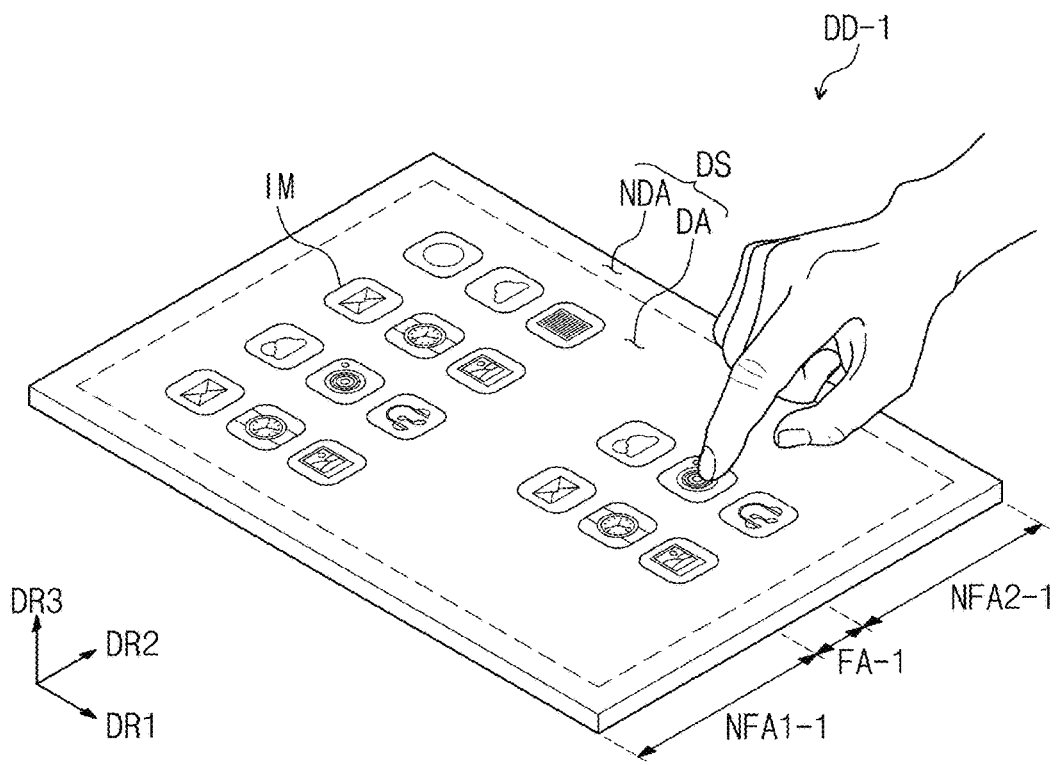
FIG. 2A is a perspective view illustrating a display device according to an embodiment of the invention.
Figure 2B:
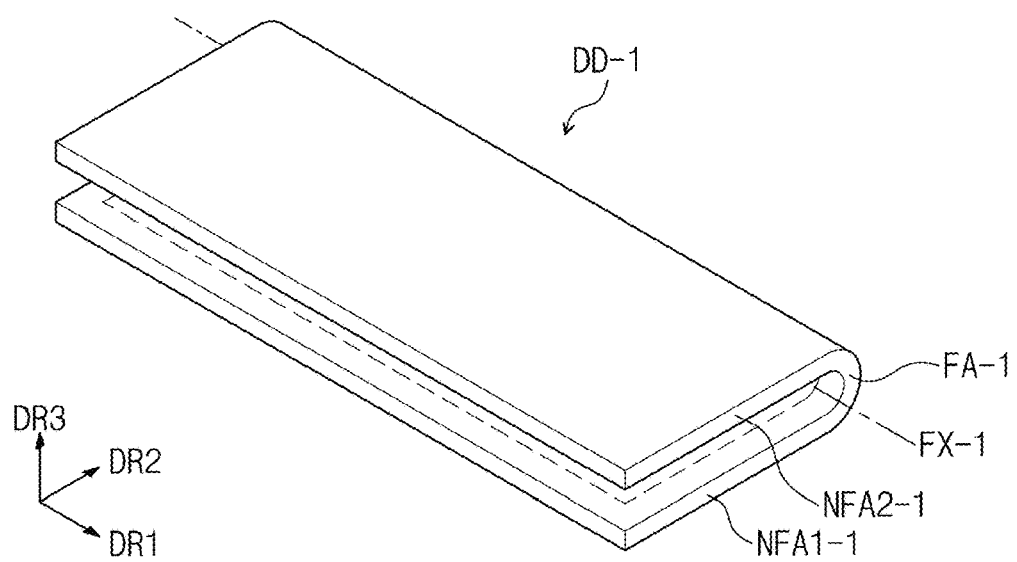
FIG. 2B is a view illustrating the display device of FIG. 2A in a folded state.

FIG. 2A is a perspective view illustrating a display device according to an embodiment of the invention. FIG. 2B is a view illustrating the display device of FIG. 2A in a folded state.

Referring to FIGS. 2A and 2B, in an embodiment, a first non-folding area NFA1-1, a folding area FA-1, and a second non-folding area NFA2-1 may be sequentially defined on a display device DD-1 in the second direction DR2. The folding area FA-1 may be between the first non-folding area NFA1-1 and the second non-folding area NFA2-1.

In an embodiment, the display device DD-1 may be folded with respect to a folding axis FX-1. In such an embodiment, the folding area FA-1 may be bent with respect to the folding axis FX-1. The folding axis FX-1 may extend in the first direction DR1. The folding axis FX-1 may be defined as a major axis that is parallel to a long side of the display device DD.

Hereinafter, for convenience of description, a structure of embodiment of the display device DD foldable with respect to the minor axis will be described in detail, but the embodiment of the invention is not limited thereto. Structures, which will be described below, may be also applied to the display device DD-1 foldable with respect to the major axis.

Figure 3:
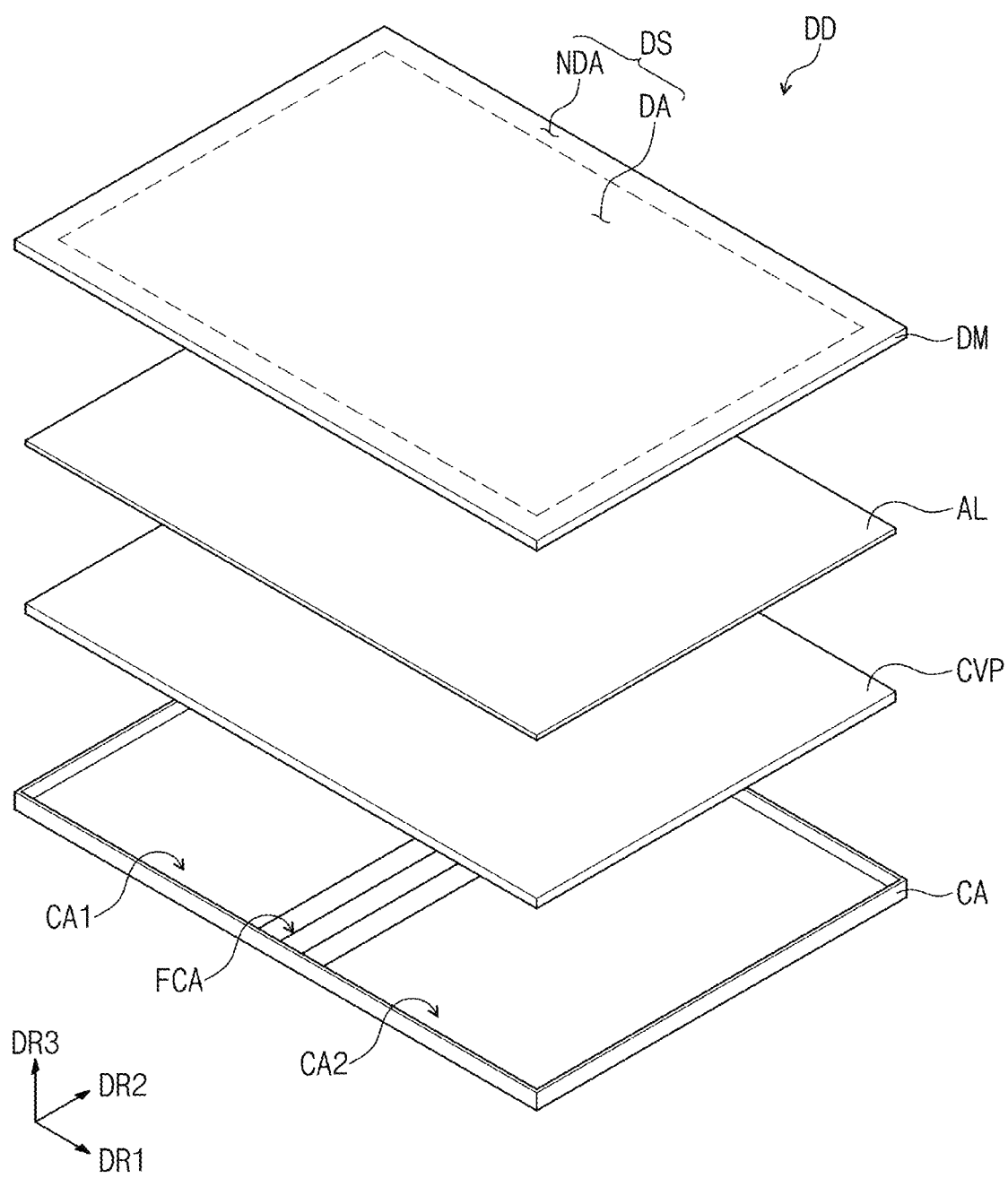
FIG. 3 is an exploded perspective view illustrating a display device according to an embodiment of the invention.

FIG. 3 is an exploded perspective view illustrating the display device according to an embodiment of the invention.

Referring to FIG. 3, an embodiment of the display device DD may include a display module DM, an adhesive layer AL, a cover member CVP, and a case member CA.

The display module DM may display an image IM (refer to FIG. 1A) and detect an external input TC (refer to FIG. 1A). The external input TC may be an input of a user. In such an embodiment, the input of the user may include various types of external inputs by a portion of a user's body, light, heat, a pen, or pressure, for example. In an embodiment, as shown in FIGS. 1A and 2A, the external input TC may be a touch of a user's hand on the display surface DS, for example, but the embodiment of the invention is not limited thereto. In an embodiment of the invention, as described above, the external input TC may be in various types, and the external input TC applied to a side surface or a rear surface of the display device DD may be detected according to the structure of the display device DD.

The cover member CVP may be disposed below the display module DM. The cover member CVP may protect the display module DM while supporting the rear surface of the display module DM. The cover member CVP will be described in detail later.

The adhesive layer AL may be disposed between the display module DM and the cover member CVP. The display module DM and the cover member CVP may be coupled to each other by the adhesive layer AL. The adhesive layer AL may include a typical adhesive or sticking agent. In an alternative embodiment of the invention, the adhesive layer AL may be omitted.

The case member CA may be disposed at an outermost portion of the display device DD and accommodate components therein. The case member CA may include a bottom surface and a sidewall extending from the bottom surface. In an embodiment, the display module DM, the adhesive layer AL, the cover member CVP, and electronic modules (not shown) may be accommodated in an inner space defined by the bottom surface and the side surface of the case member CA. The electronic modules may include, e.g., a camera, a flash, a fingerprint sensor, a battery, and a functional sensor, and the functional sensor may be a proximity sensor, a color tone detection sensor, an illuminance sensor, a motion sensor, or a heat beat sensor, but not being limited thereto. In such an embodiment, a portion of the camera, the flash, the fingerprint sensor, the battery, and the functional sensor may be omitted, and other electronic modules may be further disposed in the inner space of the cover member CVP.

The case member CA may include or be made of a material having a relatively higher rigidity than that of the display module DM. In one embodiment, for example, the case member CA may include a plurality of frames and/or plates, which are/is made of a glass, a plastic, a metal or a combination thereof. The case member CA may effectively protect the components of the display device DD, which are accommodated in the inner space, from external impact.

In an embodiment, the case member CA may include a first case part CA1, a second case part CA2, and a folding case part FCA. The folding case part FCA may be disposed between the first case part CA1 and the second case part CA2. The folding case part FCA may include a hinge structure or a flexible material.

FIGS. 4A to 4F are cross-sectional views illustrating the display module according to an embodiment of the invention. FIGS. 4A to 4F are schematic views showing a lamination relationship between functional panels and/or functional units of the display modules.

FIGS. 4A to 4F illustrate a cross-section defined by the first direction DR1 and the third direction DR3. The third direction DR3 may be a direction perpendicular to a plane defined by the first direction DR1 and the second direction DR2. In this specification, an expression of "when viewed from a plan view" or "on a plane" may represent a state when viewed from a plan view in the third direction DR3.

In an embodiment of the invention, the display module DM (refer to FIG. 3 may include a display panel, an input sensing unit, an anti-reflection unit, and a window unit. At least some of the display panel, the input sensing unit, the anti-reflection unit, and the window unit may be provided through a continuous process or may be coupled to each other by using an adhesive member. The display module DM may be one of the embodiments of display module DM-1, DM-2, DM-3, DM-4, DM-5, and DM-6 shown in FIGS. 4A to 4F.

In an embodiment, as shown in FIGS. 4A to 4F, an adhesive member may be an optical clear adhesive member OCA, for example. Hereinafter, the adhesive member may include a typical adhesive or sticking agent. In an embodiment of the invention, the anti-reflection unit and the window unit may be omitted or replaced by a different component.

In FIGS. 4A to 4F, among the input sensing unit, the anti-reflection unit and the window unit, a component formed with another component through a continuous process is expressed by a "layer". Among the input sensing unit, the anti-reflection unit and the window unit, a component coupled to another component through an adhesive member is expressed by a "panel". The panel may include a base layer providing a base surface, e.g., a synthetic resin film, a composite material film or a glass substrate. However, the "layer" may not include the base layer. That is, the above-described units expressed as a "layer" are disposed on a base surface provided by another unit.

The input sensing unit, the anti-reflection unit and the window unit may be referred to as an input sensing panel ISP, an anti-reflection panel RPP, and a window panel WP, or an input sensing layer ISL, an anti-reflection layer RPL and a window layer WL based on an existence of a base layer.

Figure 4A:
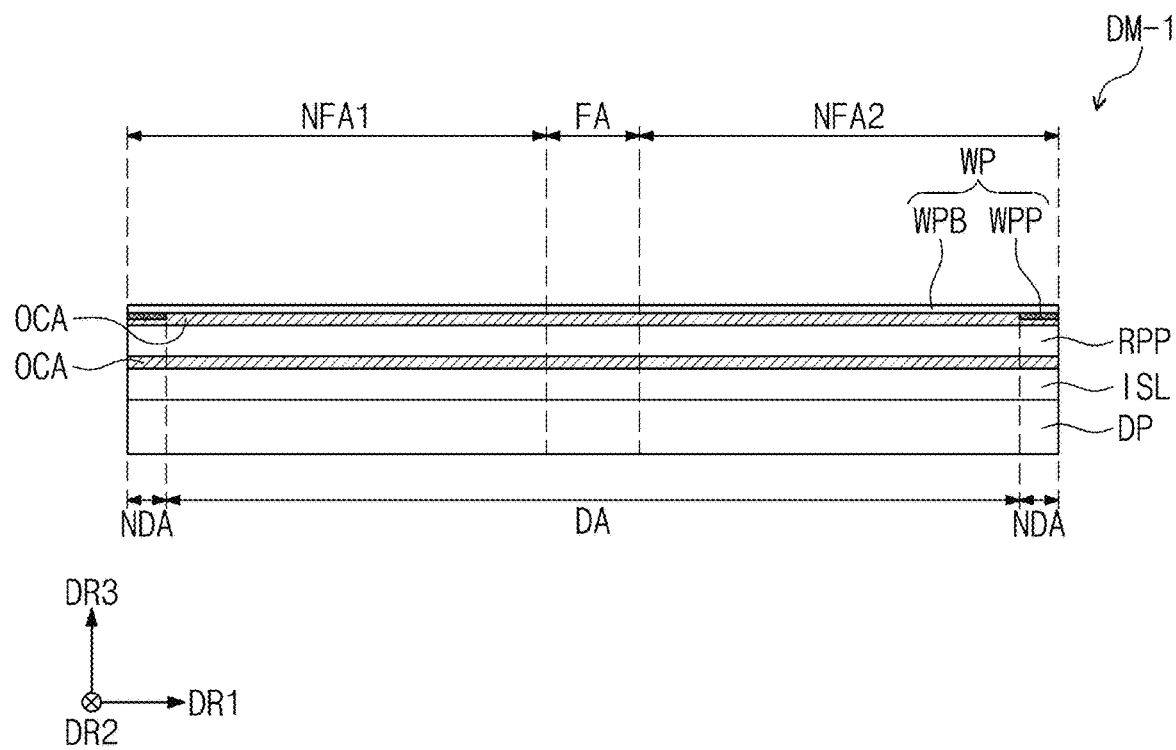
FIGS. 4A to 4F are cross-sectional views illustrating a display module according to an embodiment of the invention.

In an embodiment, as illustrated in FIG. 4A, the display module DM-1 may include the display panel DP, the input sensing layer ISL, the anti-reflection panel RPP, and the window panel WP. The input sensing layer ISL is disposed directly on the display panel DP. In this specification, an expression of "B component is disposed directly on A component" represents that an additional adhesion layer/adhesion member is not present between A component and B component. The B component may be formed on a base surface provided by the A component through a continuous process after the A component is formed.

The optically clear adhesive member OCA is disposed between the display module DM and the anti-reflection panel RPP and between the anti-reflection panel RPP and the window panel WP.

The display panel DP generates an image, and the input sensing layer ISL acquires coordinate information of an external input (e.g., a touch event).

In an embodiment, the display panel DP may be a light emitting display panel, but the embodiment of the invention is not particularly limited thereto. In such an embodiment, the display panel DP may be an organic light emitting display panel or a quantum dot light emitting display panel. The organic light emitting diode may include a light emitting layer including an organic light emitting material. The quantum-dot light emitting display panel may include a light emitting layer including a quantum dot or a quantum rod. Hereinafter, for convenience of description, embodiments where the display panel DP is the organic light emitting display panel will be described in detail.

The input sensing layer ISL may include a plurality of insulation layers and a plurality of conductive layers. The plurality conductive layers may include a sensing electrode for detecting an external input, a sensing line connected to the sensing electrode, and a sensing pad connected to the sensing line. The input sensing layer ISL may detect an external input in a mutual capacitance method and/or a self-capacitance method. However, the embodiment of the invention is not limited to the method of detecting an external input.

The anti-reflection panel RPP decreases a reflectance of external light, which is incident from an outside above the window panel WP. In an embodiment, the anti-reflection panel RPP may include a retarder and a polarizer. The retarder may be a film type or a liquid crystal coating type and include a $\lambda/2$ retarder and/or a $\lambda/4$ retarder. The polarizer may be a film type or a liquid crystal coating type. The film type may include an elongated synthetic resin film, and the liquid crystal coating type may include liquid crystals oriented in a predetermined orientation. The retarder and the polarizer may further include a protection film. The retarder and polarizer itself or the protection film may define or function as a base layer of the anti-reflection panel RPP.

In an embodiment, the anti-reflection panel RPP may include color filters. The color filters have a predetermined orientation. The color filters may be oriented based on colors emitted by pixels contained in the display panel DP. The anti-reflection panel RPP may further include a black matrix disposed adjacent to the color filters.

In an embodiment, the anti-reflection panel RPP may include a destructive interference structure. In one embodiment, for example, the destructive interference structure may include a first reflection layer and a second reflection layer, which are disposed in different layers from each other. First reflective light and second reflective light, which are reflected by the first reflection layer and a second reflection layer, respectively, may be destructively interfered, and thus a reflectance of external light may decrease.

In an embodiment, the window panel WP includes a base film WPB and a light shielding pattern WPP. The base film WPB may include a glass substrate and/or a synthetic resin film. The base film WPB is not limited to a single layer. The base film WPB may include two or more films coupled by an adhesive member.

The light shielding pattern WPP partially overlaps the base film WPB. The light shielding pattern WPP may be disposed on a rear surface of the base film WPB to define a bezel area of the display device DD, i.e., the non-display area NDA.

The light shielding pattern WPP may be a colored organic layer and formed by, e.g., a coating method. In an embodiment, the window panel WP may further include a functional coating layer (not shown) disposed on a front surface of the base film WPB. The functional coating layer may include a fingerprint proof layer, an anti-reflection layer or a hard coating layer. In FIGS. 4B to 4F, for convenience of illustration, the window panel WP and the window layer WL are schematically illustrated without distinguishing the base film WPB and the light shielding pattern WPP.

Figure 4B:
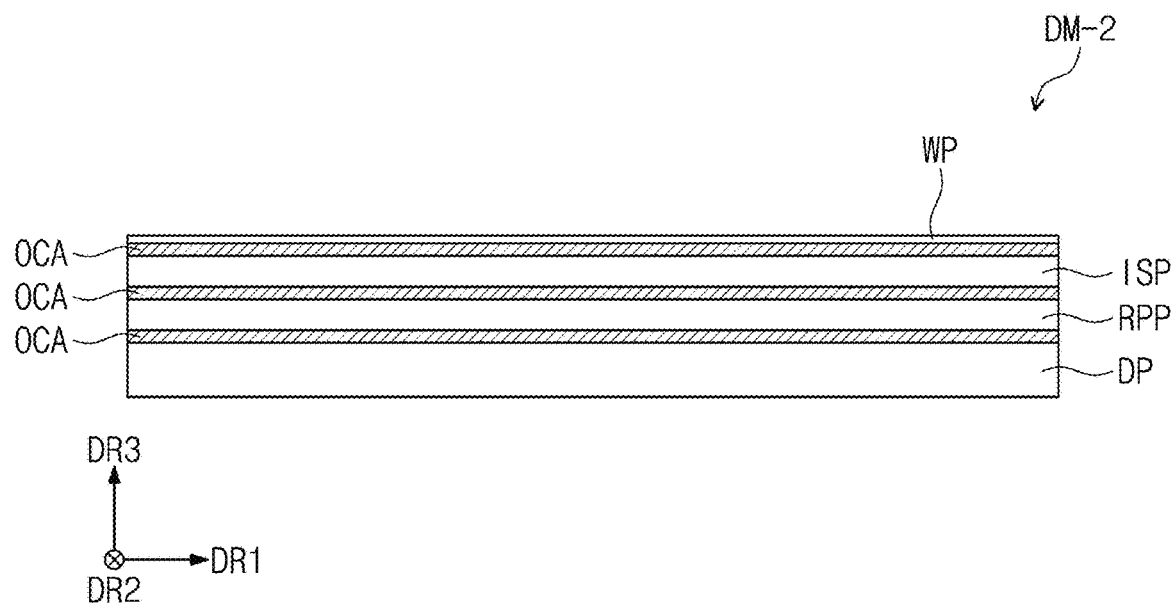
Figure 4C:
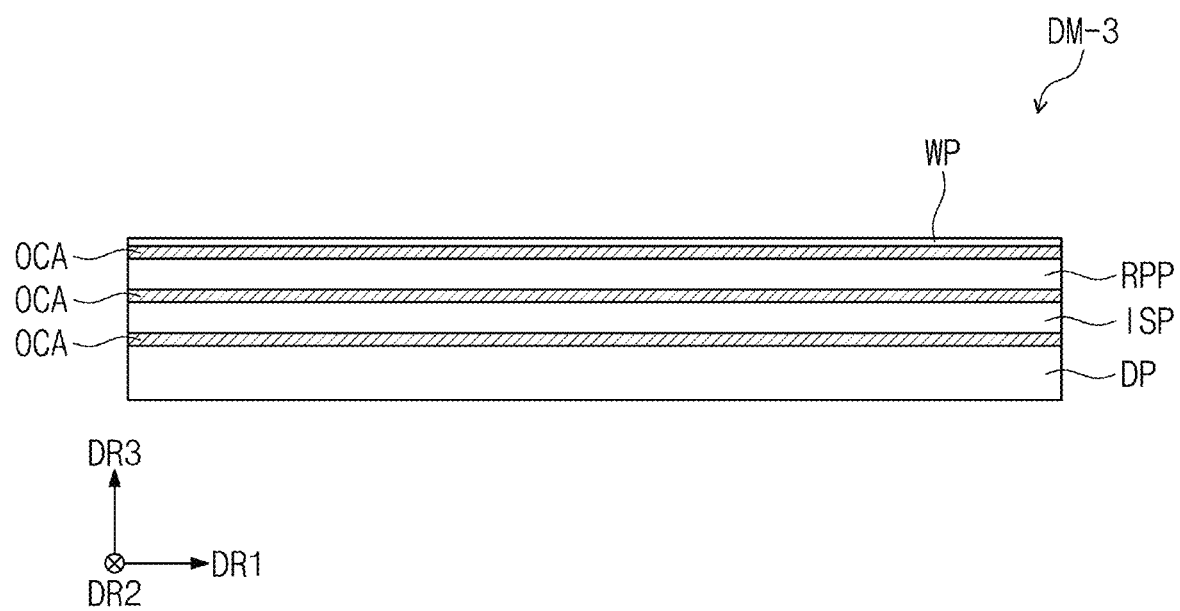

In an embodiment, as illustrated in FIGS. 4B and 4C, the display module DM-2 or DM-3 may include the display panel DP, the input sensing panel ISP, the anti-reflection panel RPP, and the window panel WP. A lamination sequence of the input sensing panel ISP and the anti-reflection panel RPP of the display module DM-2 shown in FIG. 4B may be different from that of the input sensing panel ISP and the anti-reflection panel RPP of the display module DM-3 shown in FIG. 4C.

Figure 4D:
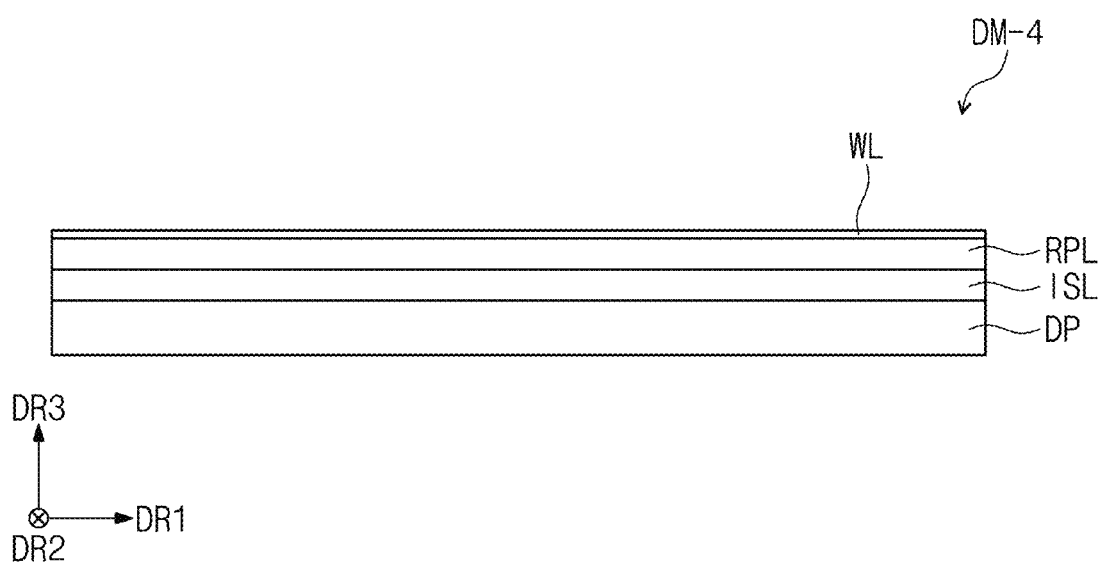

In an embodiment, as illustrated in FIG. 4D, the display module DM-4 may include the display panel DP, the input sensing layer ISL, the anti-reflection layer RPL, and the window layer WL. The input sensing layer ISL, the anti-reflection layer RPL, and the window layer WL may be provided on a base surface provided by the display panel DP through a continuous process. A lamination sequence of the input sensing layer ISL and the anti-reflection layer RPL may be modified.

Figure 4E:
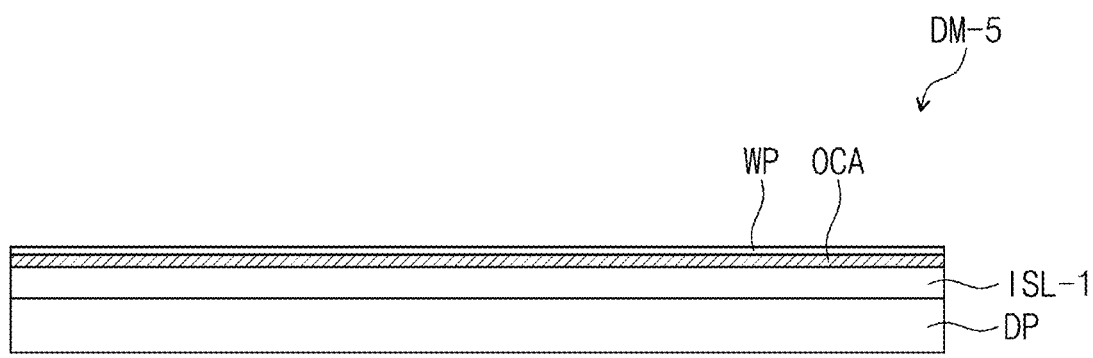
Figure 4F:
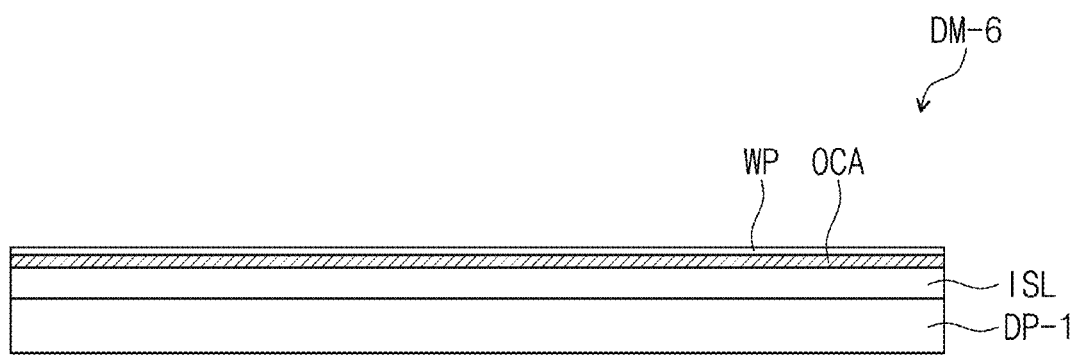

In an embodiment, as illustrated in FIGS. 4E and 4F, the display module DM-5 or DM-6 may not include a separate anti-reflection unit.

In an embodiment, as illustrated in FIG. 4E, the display module DM-5 may include the display panel DP, the input sensing layer ISL-1, and the window panel WP. In such an embodiment, the input sensing layer ISL-1 may further have an anti-reflection function.

In an embodiment, as illustrated in FIG. 4F, the display module DM-6 may include a display panel DP-1, an input sensing layer ISL, and a window panel WP. In such an embodiment, the display panel DP-1 may further have an anti-reflection function.

In one embodiment, for example, each of the input sensing layer ISL-1 and the display panel DP-1 may further include a functional layer having the anti-reflection function. Although the functionally layer may be color filters having a predetermined orientation or a destructive interference structure having a lamination structure having different refractive indexes from each other.

Figure 5:
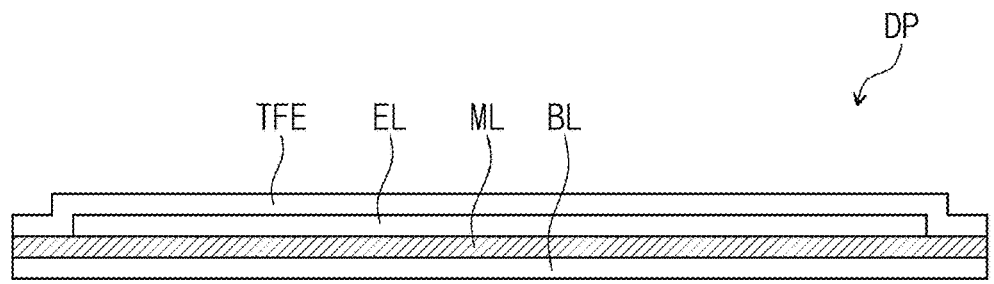
FIG. 5 is a cross-sectional view illustrating a display panel according to an embodiment of the invention.

FIG. 5 is a cross-sectional view illustrating a display panel according to an embodiment of the invention.

Referring to FIG. 5, an embodiment of the display panel DP may include a base layer BL, a circuit layer ML, a light emitting element layer EL, and a thin-film encapsulation layer TFE.

The base layer BL may include a flexible material. In one embodiment, for example, the base layer BL may be a plastic substrate. The plastic substrate may include at least one selected from an acrylic-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin. In one embodiment, for example, the base layer BL may include a single layer containing a polyimide-based resin. However, the embodiment of the invention is not limited thereto. In one embodiment, for example, the base layer BL may be a laminated structure including a plurality of insulation layers.

The circuit layer ML may be disposed on the base layer BL. The circuit layer ML may include a plurality of insulation layers, a plurality of conductive layers, and a semiconductor layer.

The light emitting element layer EL may be disposed on the circuit layer ML. The light emitting element layer EL may include a display element, e.g., an organic light emitting diode.

The thin-film encapsulation layer TFE seals the light emitting element layer EL. The thin-film encapsulation layer TFE may include a plurality of inorganic layers and at least one organic layer disposed therebetween.

Figure 6:
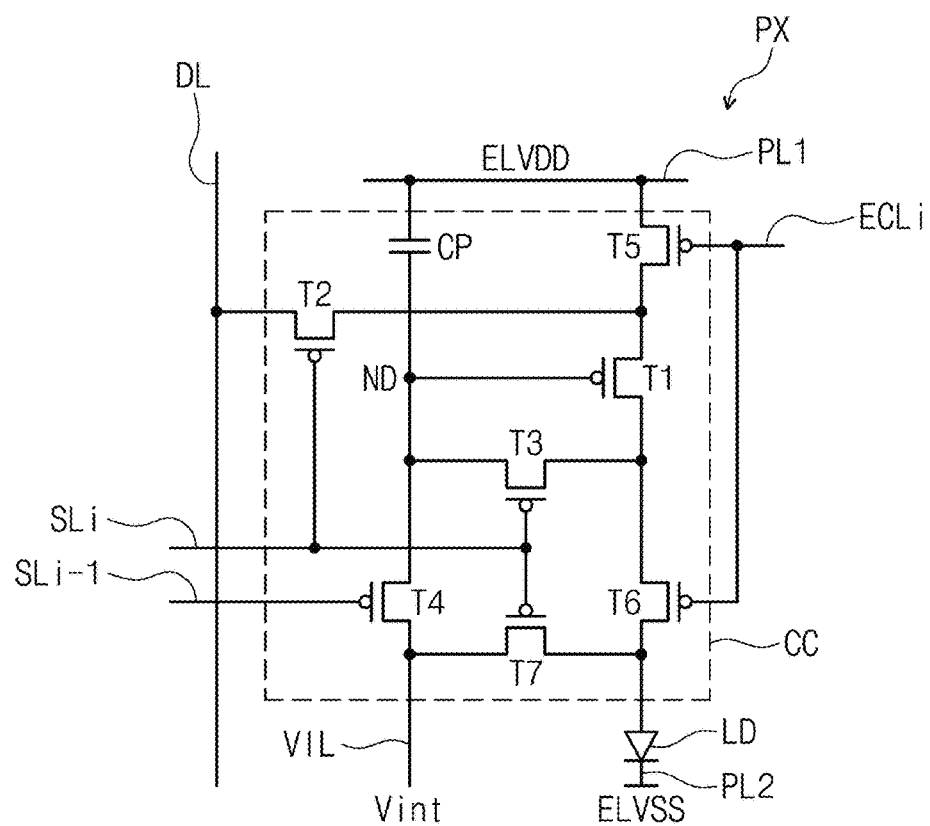
FIG. 6 is an equivalent circuit diagram of a pixel according to an embodiment of the invention.

FIG. 6 is an equivalent circuit diagram illustrating a pixel PX according to an embodiment of the invention.

Referring to FIG. 6, the pixel PX may be disposed on the display area DA (refer to FIG. 1A) to display an image.

Each of the pixels PX may be connected to a plurality of signal lines. In FIG. 6, among signal lines connected to each of the pixels PX, scan lines SLi and SLi−1, a data line DL, a first power line PL1, a second power line PL2, an initialization power line VIL and a light emitting control line ECLi are exemplarily illustrated. However, the embodiment of the invention is not limited thereto. In one embodiment, for example, the pixel PX may be additionally connected to various signal lines, or a portion of the illustrated signal lines may be omitted.

The pixel PX may include a light emitting element LD and a pixel circuit CC. The light emitting element LD may be disposed in the light emitting element layer EL in FIG. 5, and the pixel circuit CC may be disposed in the circuit layer ML in FIG. 5.

The pixel circuit CC may include a plurality of transistors T1 to T7 and a capacitor CP. The pixel circuit CC may control an amount of a current flowing through the light emitting element LD in response to a data signal.

The light emitting element LD may emit light with a predetermined luminance corresponding to the amount of the current provided from the pixel circuit CC. In such an embodiment, a first power ELVDD may be set to have a level greater than that of a second power ELVSS.

Each of the plurality of transistors T1 to T7 may include an input electrode (or source electrode), an output electrode (or drain electrode), and a control electrode (or gate electrode). Herein, for convenience, one of the input electrode and the output electrode may be referred to as a first electrode, and the other of the input electrode and the output electrode may be referred to as a second electrode.

The first transistor T1 may have a first electrode connected to the first power line PL1 through the fifth transistor T5. The first power line PL1 may be a line for providing the first power ELVDD. The first transistor T1 may have a second electrode connected to an anode electrode of the light emitting element LD through the sixth transistor T6. The first transistor T1 may also be referred to as a driving transistor.

The first transistor T1 may control an amount of a current flowing through the light emitting element LD based on a voltage applied to a control electrode thereof.

The second transistor T2 is connected between the data line DL and the first electrode of the first transistor T1. In an embodiment, a control electrode of the second transistor T2 is connected to an i-th scan line SLi. When the i-th scan signal is provided to the i-th scan line SLi, the second transistor T2 is turned on to electrically connect the data line DL and the first electrode of the first transistor T1 to each other.

The third transistor T3 is connected between the control electrode of the first transistor T1 and the second electrode of the first transistor T1. A control electrode of the third transistor T3 is connected to the i-th scan line SLi. When the i-th scan signal is provided to the i-th scan line SLi, the third transistor T3 is turned on to electrically connect the second electrode of the first transistor T1 and the control electrode of the first transistor T1. Accordingly, when the third transistor T3 is turned on, the first transistor T1 is diode-connected.

The fourth transistor T4 is connected between a node ND and the initialization power generation line VIL. Also, a control electrode of the fourth transistor T4 is connected to an (i−1)-th scan line SLi−1. The node ND may be a node at which the fourth transistor T4 is connected to the control electrode of the first transistor T1. When an (i−1)-th scan signal is provided to the (i−1)-th scan line SLi−1, the fourth transistor T4 is turned on to provide an initialization voltage Vint to the node ND.

The fifth transistor T5 is connected between the first power line PL1 and the first electrode of the first transistor T1. The sixth transistor T6 is connected between the second electrode of the first transistor T1 and the anode electrode of the light emitting element LD. A control electrode of the fifth transistor T5 and a control electrode of the sixth transistor T6 are connected to the i-th light emitting control line ECLi.

The seventh transistor T7 is connected between the initialization power line VIL and the anode electrode of the light emitting element LD. Also, a control electrode of the second transistor T2 is connected to the i-th scan line SLi. When the i-th scan signal is provided to the scan line SLi, the seventh transistor T7 is turned on to provide the initialization voltage Vint to the anode electrode of the light emitting element LD.

The seventh transistor T7 may improve a black color expression capability of the pixel PX. In such an embodiment, when the seventh transistor T7 is turned on, a parasitic capacitor (not shown) of the light emitting element LD is discharged. Then, the light emitting element LD does not emit light due to a leakage current from the first transistor T1 when black luminance is realized, and thus the black expression capability may improve.

In an embodiment, as shown in FIG. 6, the control electrode of the seventh transistor T7 may connected to the i-th scan line SLi, but the embodiment of the invention is not limited thereto. In an alternative embodiment of the invention, the control electrode of the seventh transistor T7 may be connected to the (i−1)-th scan line SLi−1 or the (i+1)-th scan line (not shown).

FIG. 6 shows an embodiment where the transistors are p-type metal-oxide-semiconductor ("PMOS") transistors, but the embodiment of the invention is not limited thereto. In an alternative embodiment of the invention, the pixel circuit CC may include n-type metal-oxide-semiconductor ("NMOS") transistors. In another alternative embodiment of the invention, the pixel circuit CC may include a combination of a NMOS transistor and a PMOS transistor.

The capacitor CP is disposed between the first power line PL1 and the node ND. The capacitor CP stores a voltage corresponding to the data signal. According to the voltage stored in the capacitor CP, an amount of a current flowing through the first transistor T1, when the fifth transistor T5 and the sixth transistor T6 are turned on, may be determined.

The light emitting element LD may be electrically connected to the sixth transistor T6 and the second power line PL2. The light emitting element LD may receive the second power ELVSS through the second power line PL2.

The light emitting element LD may emit light by a voltage corresponding to a difference between a signal transmitted through the sixth transistor T6 and the second power ELVSS received through the second power line PL2.

Embodiments of the invention are not limited to the structure of the pixel PX illustrated in FIG. 6. In such embodiments of the invention, the pixel PX may be realized or modified in various types for allowing the light emitting element LD to emit light.

Figure 7:
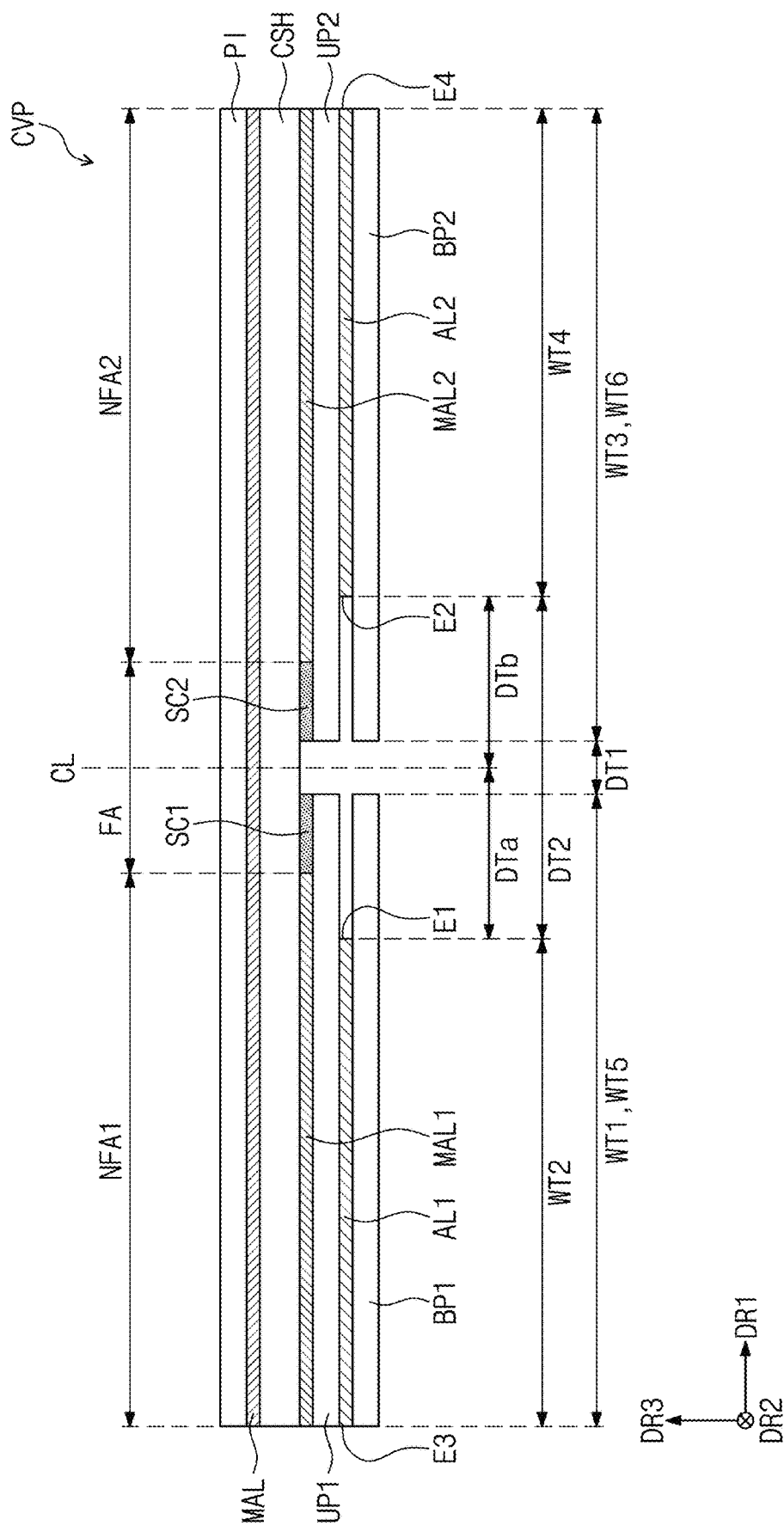
FIG. 7 is a cross-sectional view illustrating a cover member according to an embodiment of the invention.

FIG. 7 is a cross-sectional view illustrating a cover member according to an embodiment of the invention.

Referring to FIG. 7, the cover member CVP may include protection layer PI, a cushion layer CSH, a first upper plate UP1, a second upper plate UP2, a first lower plate BP1, a second lower plate BP2, an intermediate adhesive layer MAL, a first intermediate adhesive layer MAL1, a second intermediate adhesive layer MAL2, a first step compensation layer SC1, a second step compensation layer SC2, a first attachment layer AL1, and a second attachment layer AL2.

The protection layer PI may be disposed below the display module DM (refer to FIG. 3). The protection layer PI may protect a rear surface of the display module DM. The protection layer PI may be a flexible plastic film. In one embodiment, for example, the protection layer PI may be a polyimide film or a polyethylene terephthalate film. However, the embodiment of the invention is not limited to the above-described example of the protection layer PI.

The intermediate adhesive layer MAL may be disposed below the protection layer PI and attached to a rear surface of the protection layer PI.

The cushion layer CSH may be disposed below the intermediate adhesive layer MAL and attached to a rear surface of the intermediate adhesive layer MAL. The cushion layer CSH may include a sponge, a foam, or a urethane resin.

The first intermediate adhesive layer MAL1, the second intermediate adhesive layer MAL2, the first step compensation layer SC1 and the second step compensation layer SC2 may be disposed below the cushion layer CSH. Both opposing surfaces (e.g., upper and lower surfaces) of each of the first intermediate adhesive layer MAL1 and the second intermediate adhesive layer MAL2 may have adhesive force. One surface of each of the first step compensation layer SC1 and the second step compensation layer SC2 may have adhesive force less than that of the other surface. In one embodiment, for example, the other surface of each of the first step compensation layer SC1 and the second step compensation layer SC2 may not have adhesive force.

The first intermediate adhesive layer MAL1 may be attached to a bottom surface of the cushion layer CSH and overlap the first non-folding area NFA1 on a plane or when viewed from a plan view in the third direction DR3. The second intermediate adhesive layer MAL2 may be attached to the bottom surface of the cushion layer CSH and overlap the second non-folding area NFA2 on a plane or when viewed from a plan view in the third direction DR3.

The first step compensation layer SC1 may be adjacent to the first intermediate adhesive layer MAL1, and the second step compensation layer SC2 may be adjacent to the second intermediate adhesive layer MAL2. Thus, the first intermediate adhesive layer MAL1, the first step compensation layer SC1, the second step compensation layer SC2, and the second intermediate adhesive layer MAL2 may be sequentially arranged in the first direction DR1.

In an embodiment, the first step compensation layer SC1 and the second step compensation layer SC2 may overlap the folding area FA on the plane. When the display module DM (refer to FIG. 3) is in an unfolded state, the folding area FA of the display module DM may be supported by the first step compensation layer SC1 and the second step compensation layer SC2. When the display module DM is in a folded state, the first step compensation layer SC1 and the second step compensation layer SC2 may be spaced apart from the cushion layer CSH.

The intermediate adhesive layer MAL, the first intermediate adhesive layer MAL1 and the second intermediate adhesive layer MAL2 may be optically clear, translucent, or non-optically clear. The intermediate adhesive layer MAL, the first intermediate adhesive layer MAL1 and the second intermediate adhesive layer MAL2 may be an adhesive layer that is manufactured by applying and curing a liquefied adhesive material, or an adhesive sheet that is separately manufactured. In one embodiment, for example, the intermediate adhesive layer MAL, the first intermediate adhesive layer MAL1 and the second intermediate adhesive layer MAL2 may be a pressure sensitive adhesive ("PSA"), an optical clear adhesive ("OCA"), or an optical clear resin ("OCR").

The first upper plate UP1 may be disposed below the first intermediate adhesive layer MAL1 and the first step compensation layer SC1 and may be attached to the first intermediate adhesive layer MAL1 and the first step compensation layer SC1. The second upper plate UP2 may be disposed below the second intermediate adhesive layer MAL2 and the second step compensation layer SC2 and may be attached to the second intermediate adhesive layer MAL2 and the second step compensation layer SC2.

The first upper plate UP1 may be coupled to the cushion layer CSH by the first intermediate adhesive layer MAL1. The second upper plate UP2 may be coupled to the cushion layer CSH by the second intermediate adhesive layer MAL2.

Each of the first upper plate UP1 and the second upper plate UP2 may be a metal plate. In one embodiment, for example, the first upper plate UP1 and the second upper plate UP2 may include a stainless steel, aluminum, or an alloy thereof. Each of the first upper plate UP1 and the second upper plate UP2 may have a strength greater than that of the display module DM (refer to FIG. 3).

The first attachment layer AL1 may be attached to a bottom surface of the first upper plate UP1. The second attachment layer AL2 may be attached to a bottom surface of the second upper plate UP2. In an embodiment of the invention, each of the first attachment layer AL1 and the second attachment layer AL2 may be a PSA.

The first lower plate BP1 may be attached to a bottom surface of the first attachment layer AL1. The second lower plate BP2 may be attached to a bottom surface of the second attachment layer AL2. Each of the first lower plate BP1 and the second lower plate BP2 may be a metal plate. In one embodiment, for example, each of the first lower plate BP1 and the second lower plate BP2 may include magnesium, aluminum, or an alloy thereof. Each of the first lower plate BP1 and the second lower plate BP2 may be referred to as a set bracket.

The first upper plate UP1 and the second upper plate UP2 may be separated with respect to a folding axis FX. In an embodiment of the invention, where two folding axes are provided, three upper plates and three lower plates may be provided.

The first upper plate UP1 and the second upper plate UP2 may be spaced a first distance DT1 apart from each other in the first direction DR1. The first lower plate BP1 and the second lower plate BP2 may be spaced the first distance DT1 apart from each other in the first direction DR1.

The first attachment layer AL1 and the second attachment layer AL2 may be spaced a second distance DT2 apart from each other in the first direction DR1. The second distance DT2 may be greater than the first distance DT1. In an embodiment of the invention, the second distance DT2 may be equal to or greater than about 10 millimeters (mm) and equal to or less than about 34 mm.

Each of the first attachment layer AL1 and the second attachment layer AL2 may not overlap the folding area FA on the plane. In one embodiment, for example, the first attachment layer AL1 may be spaced about 5 mm or greater apart from a center of the folding area FA on the plane, and the second attachment layer AL2 may be spaced about 5 mm or greater apart from the center of the folding area FA on the plane. In FIG. 7, a central line CL extending in the third direction DR3 while passing through the center is illustrated.

In an embodiment of the invention, a first distance DTa from the central line CL to a first end E1 of the first attachment layer AL1 may be in a range from about 5 mm to about 17 mm. In such an embodiment, a second distance DTb from the central line CL to a second end E2 of the second attachment layer AL2 may be in a range from about 5 mm to about 17 mm.

The first end E1 may overlap the first non-folding area NFA1 while being spaced apart from a boundary between the first non-folding area NFA1 and the folding area FA, and the second end E2 may overlap the second non-folding area NFA2 while being spaced apart from a boundary between the second non-folding area NFA2 and the folding area FA. The first end E1 and the second end E2 may face each other.

The first upper plate UP1 may have a first width WT1 in the first direction DR1, which is greater than a second width WT2 of the first attachment layer AL1 in the first direction DR1. The second upper plate UP2 may have a third width WT3 in the first direction DR1, which is greater than a fourth width WT4 of the second attachment layer AL2 in the first direction DR1. The first lower plate BP1 may have a fifth width WT5 in the first direction DR1, which is the same as the first width WT1, and the second lower plate BP2 may have a sixth width WT6 in the first direction DR1, which is the same as the third width WT3.

The second width WT2 may be a distance between the first end E1 and third end E3 of the first attachment layer AL1, which are spaced apart from each other in the first direction DR1, and the fourth width WT4 may be a distance between the second end E2 and fourth end E4 of the second attachment layer AL2, which are spaced apart from each other in the first direction DR1. In such an embodiment, the third end E3 may overlap an end of the first upper plate UP1 on the plane, and the fourth end E4 may overlap an end of the second upper plate UP2 on the plane.

According to an embodiment of the invention, at least a portion of each of the first upper plate UP1 and the first lower plate BP1 may not be attached to the first attachment layer AL1. In such an embodiment, at least a portion of each of the second upper plate UP2 and the second lower plate BP2 may not be attached to the second attachment layer AL2. The above-described portions, which are not attached to the first attachment layer AL1 and the second attachment layer AL2, respectively, may overlap the folding area FA on the plane.

The first intermediate adhesive layer MAL1 may have a width in the first direction DR1, which is greater than the second width WT2, and the second intermediate adhesive layer MAL2 may have a width in the first direction DR1, which is greater than the fourth width WT4.

Figure 8:
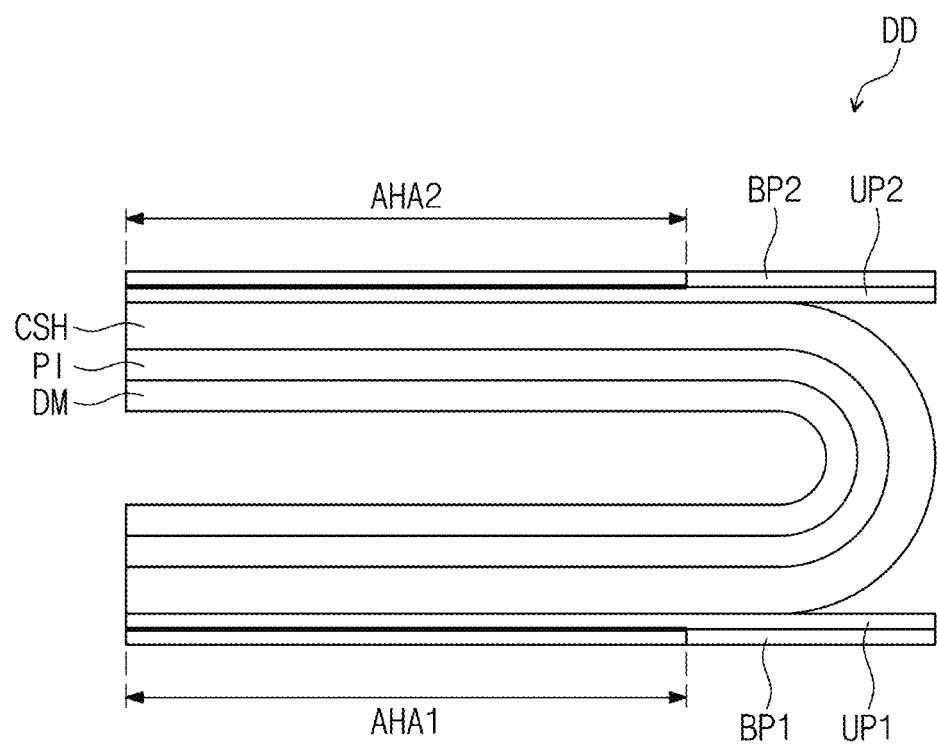
FIG. 8 is a cross-sectional view of a display device in a folded state according to an alternative embodiment of the invention.

FIG. 8 is a cross-sectional view of the display device in a folded state according to an embodiment of the invention.

More particularly, the display module DM, the protection layer PI, the cushion layer CSH, the first upper plate UP1, the second upper plate UP2, the first lower plate BP1 and the second lower plate BP2 of the display device are illustrated in FIG. 8.

When the display device DD is folded, the display module DM, the protection layer PI and the cushion layer CSH may be folded, and the first upper plate UP1, the second upper plate UP2, the first lower plate BP1 and the second lower plate BP2 may not be folded. In one embodiment, for example, a portion of the first upper plate UP1, which overlaps the folding area FA (refer to FIG. 1B) in an unfolded state, may be spaced apart from the cushion layer CSH, and a portion of the second upper plate UP2, which overlaps the folding area FA in the unfolded state, may be spaced apart from the cushion layer CSH.

In FIG. 8, a first area AHA1 in which the first attachment layer AL1 (refer to FIG. 7) is attached and a second area AHA2 in which the second attachment layer AL2 (refer to FIG. 7) is attached are illustrated.

Figure 9A:
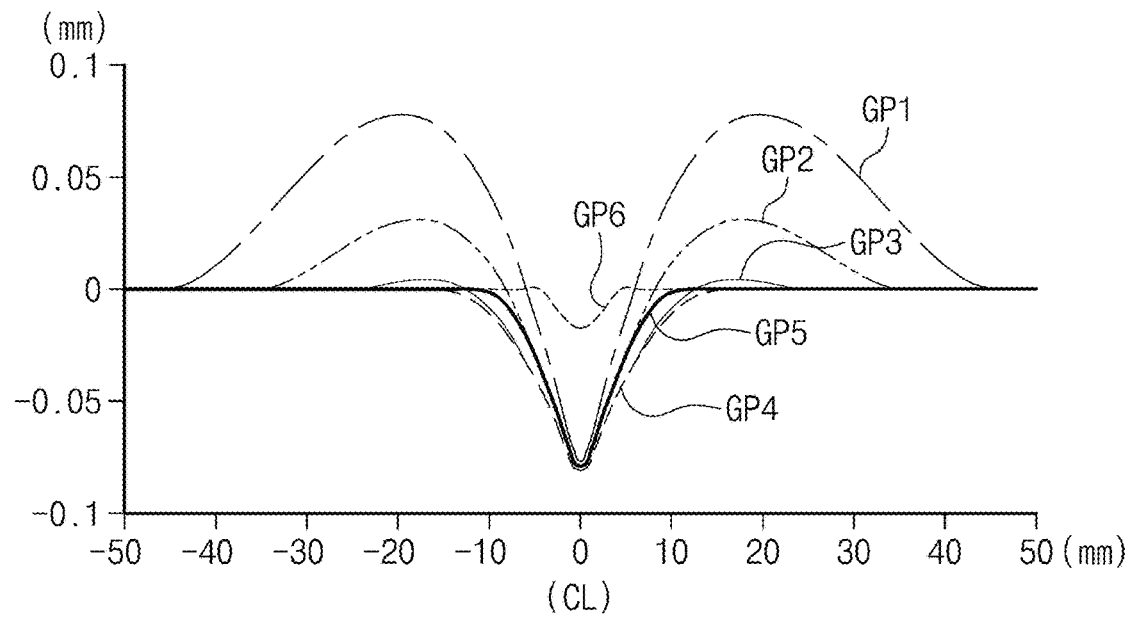
FIG. 9A is a graph showing a deformation degree of the display module for each position.

FIG. 9A is a graph showing a deformation degree of the display module for each position.

Referring to FIG. 9A, in the graph, X-axis represents a distance spaced apart from the central line CL (refer to FIG. 7) in the first direction DR1, and Y-axis represents a protruding degree of a top surface of the display module DM (refer to FIG. 3) in the third direction DR3. In FIG. 9A, first to sixth graphs GP1, GP2, GP3, GP4, GP5, and GP6 are illustrated.

Referring to FIGS. 7 and 9A, the first graph GP1 shows the deformation degree of the display module DM when each of the first distance DTa and the second distance DTb is about 45 mm. The second graph GP2 shows the deformation degree of the display module DM when each of the first distance DTa and the second distance DTb is about 35 mm. The third graph GP3 shows the deformation degree of the display module DM when each of the first distance DTa and the second distance DTb is about 25 mm. The fourth graph GP4 shows the deformation degree of the display module DM when each of the first distance DTa and the second distance DTb is about 15 mm. The fifth graph GP5 shows the deformation degree of the display module DM when each of the first distance DTa and the second distance DTb is about 10 mm. The sixth graph GP6 shows the deformation degree of the display module DM when each of the first distance DTa and the second distance DTb is about 4 mm.

The first to third graphs GP1, GP2, and GP3 and the sixth graph GP6 may be graphs according to a comparative example of the invention, and the fourth and fifth graphs GP4 and GP5 may be graphs according to an embodiment of the invention.

Due to repeated folding and unfolding operations and maintaining of the folded state for a long time, a curved deformation may occur in the foldable display device. Due to the curved deformation, a portion of the top surface of the display module may protrude or be recessed.

With respect to about 0 in Y-axis of the graph, plus (+) values may represent that the top surface of the display module DM protrudes further than a reference surface, and minus (−) values may represent that the top surface of the display module DM is recessed further than the reference surface. The reference surface may be a display surface of the display module DM before being deformed.

Referring to the first to third graphs GP1, GP2, and GP3, a portion of the top surface of the display module DM may protrude. However, referring to the fourth and fifth graphs GP4 and GP5 according to an embodiment of the invention, a portion of the display module DM may be only recessed instead of protruding.

Figure 9B:
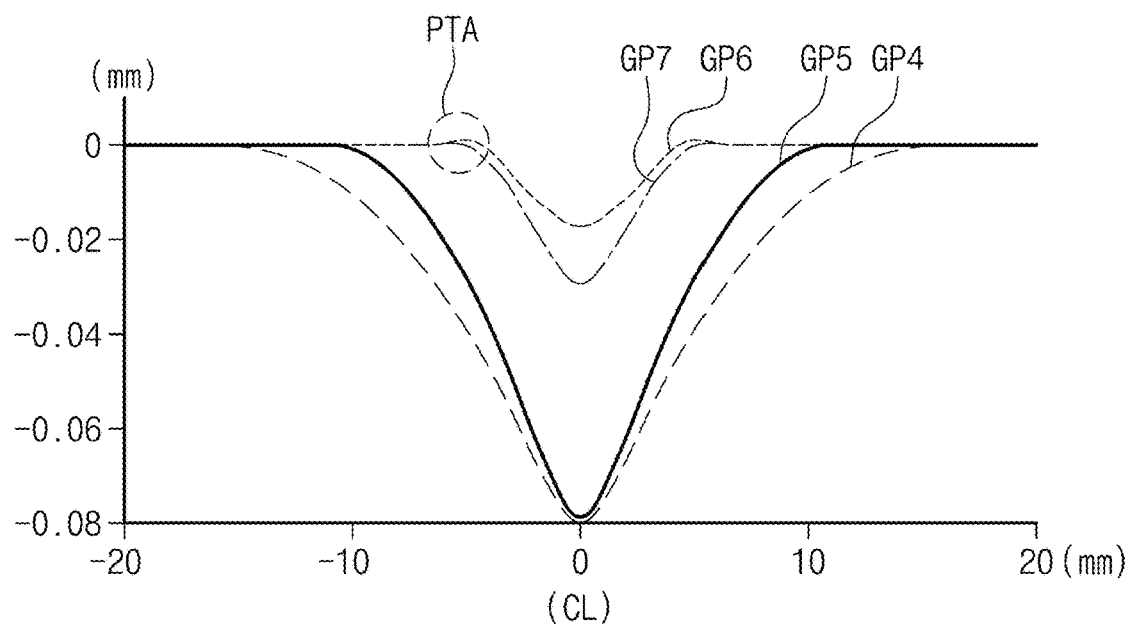
FIG. 9B is a graph showing a deformation degree of the display module for each position.

FIG. 9B is a graph showing the deformation degree of the display module for each position.

More particularly, the fourth to sixth graphs GP4, GP5, and GP6 in FIG. 9A are enlargedly illustrated in FIG. 9B. Also, a seventh graph GP7 shows the deformation degree of the display module DM when each of the first distance DTa and the second distance DTb is about 5 mm.

Referring to the sixth graph GP6, lifting may occur in portions PTA adjacent to the ends of the first attachment layer AL1 and the second attachment layer AL2. In the seventh graph GP7, it may be confirmed that the display module DM does not protrude.

According to an embodiment of the invention, each of the first distance DTa and the second distance DTb may be in a range from about 5 mm to about 17 mm. Thus, the top surface of the display module DM may not protrude upward. In such an embodiment, a visibility degree of the curved deformation of the display device DD (refer to FIG. 1A) may decrease, and a product reliability may improve.

Figure 10A:
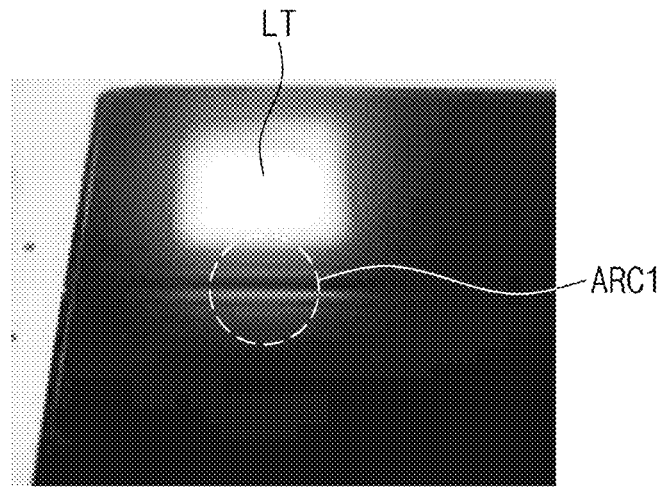
FIG. 10A is a photograph showing a display device according to a comparative example of the invention.
Figure 10B:
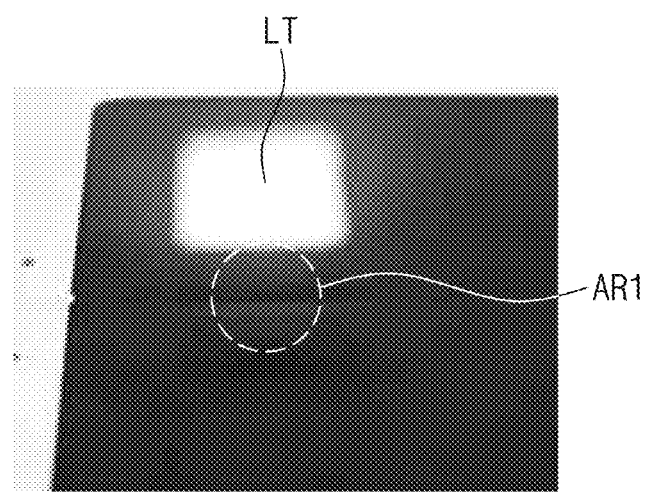
FIG. 10B is a photograph showing a display device according to an embodiment of the invention.

FIG. 10A is a photograph showing a display device according to a comparative example of the invention. FIG. 10B is a photograph showing the display device according to an embodiment of the invention. In particular, FIG. 10A is a photograph taken when each of the first distance DTa (refer to FIG. 7) and the second distance DTb (refer to FIG. 7) is about 4 mm, and FIG. 10B is a photograph taken when each of the first distance DTa (refer to FIG. 7) and the second distance DTb (refer to FIG. 7) is about 13 mm. A visibility evaluation of the curved deformation may be performed by using illumination LT.

As shown by a first comparative area ARC1 in FIG. 10A and a first area AR1 in FIG. 10B, it may be confirmed that a curved portion in the first comparative area Arc1 is further easily seen. That is, a deformation the top surface of the display module DM protrudes during the deformation of the display module DM (refer to FIG. 3) may be more visible to a user than a deformation in which the top surface of the display module DM is recessed.

According to an embodiment of the invention, the first attachment layer AL1 (refer to FIG. 7) and the second attachment layer AL2 (refer to FIG. 7) may be spaced a predetermined distance from the center of the display module DM (refer to FIG. 3). In one embodiment, for example, the predetermined distance may be in a range from about 5 mm to about 17 mm. Thus, the deformation in which the top surface of the display module DM protrudes may decrease, and the visibility degree of the curved deformation may decrease.

Figure 11A:
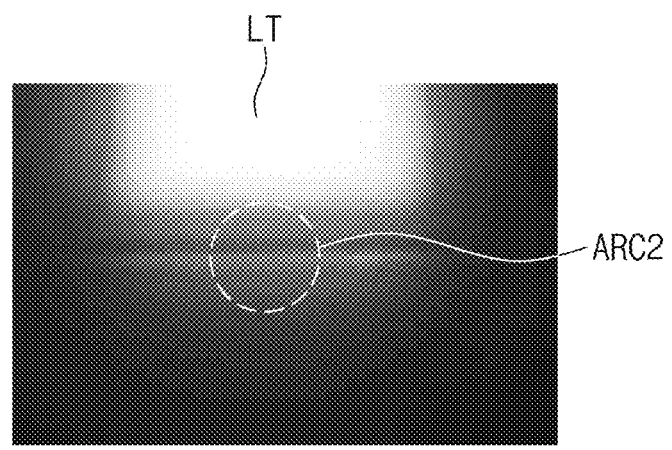
FIG. 11A is a photograph showing a display device according to a comparative example of the invention.

FIG. 11A is a photograph showing a display device according to a comparative example of the invention. FIG. 11 is a photograph showing the display device according to an embodiment of the invention.

Figure 11B:
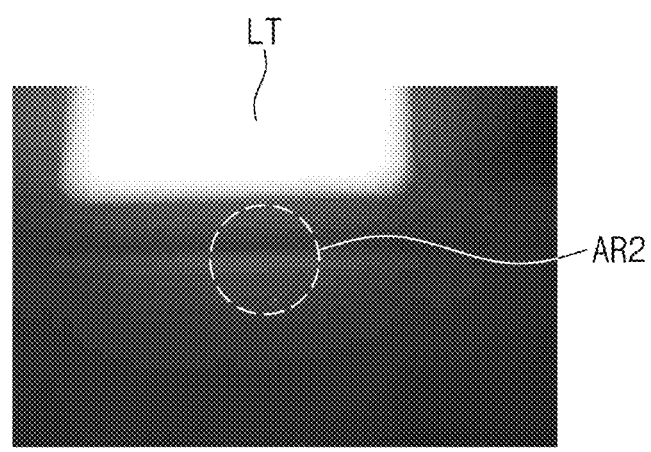
FIG. 11B is a photograph showing a display device according to an embodiment of the invention.

Each of the first attachment layer AL1 (refer to FIG. 7) and the second attachment layer AL2 (refer to FIG. 7) of the display device in FIG. 11A may be a thermal deformation tape, and each of the first attachment layer AL1 (refer to FIG. 7) and the second attachment layer AL2 (refer to FIG. 7) of the display device in FIG. 11B may be a pressure sensitive adhesive.

The pressure sensitive adhesive has a flexibility greater than that of the thermal deformation tape. Thus, when folding and unfolding operations are repeated and the folded state is maintained for a long time, a shear deformation may be generated in the pressure sensitive adhesive.

As shown by a first comparative area ARC2 in FIG. 11A and a first area AR2 in FIG. 11B, it may be confirmed that curvedness is further visible in the first comparative area ARC2. That is, as the first attachment layer AL1 and the second attachment layer AL2 are shear-deformed, the degree of the curved deformation of the display module DM may be relieved. Thus, when each of the first attachment layer AL1 and the second attachment layer AL2 is realized by the pressure sensitive adhesive, the visibility of the curved deformation may decrease.

Figure 12:
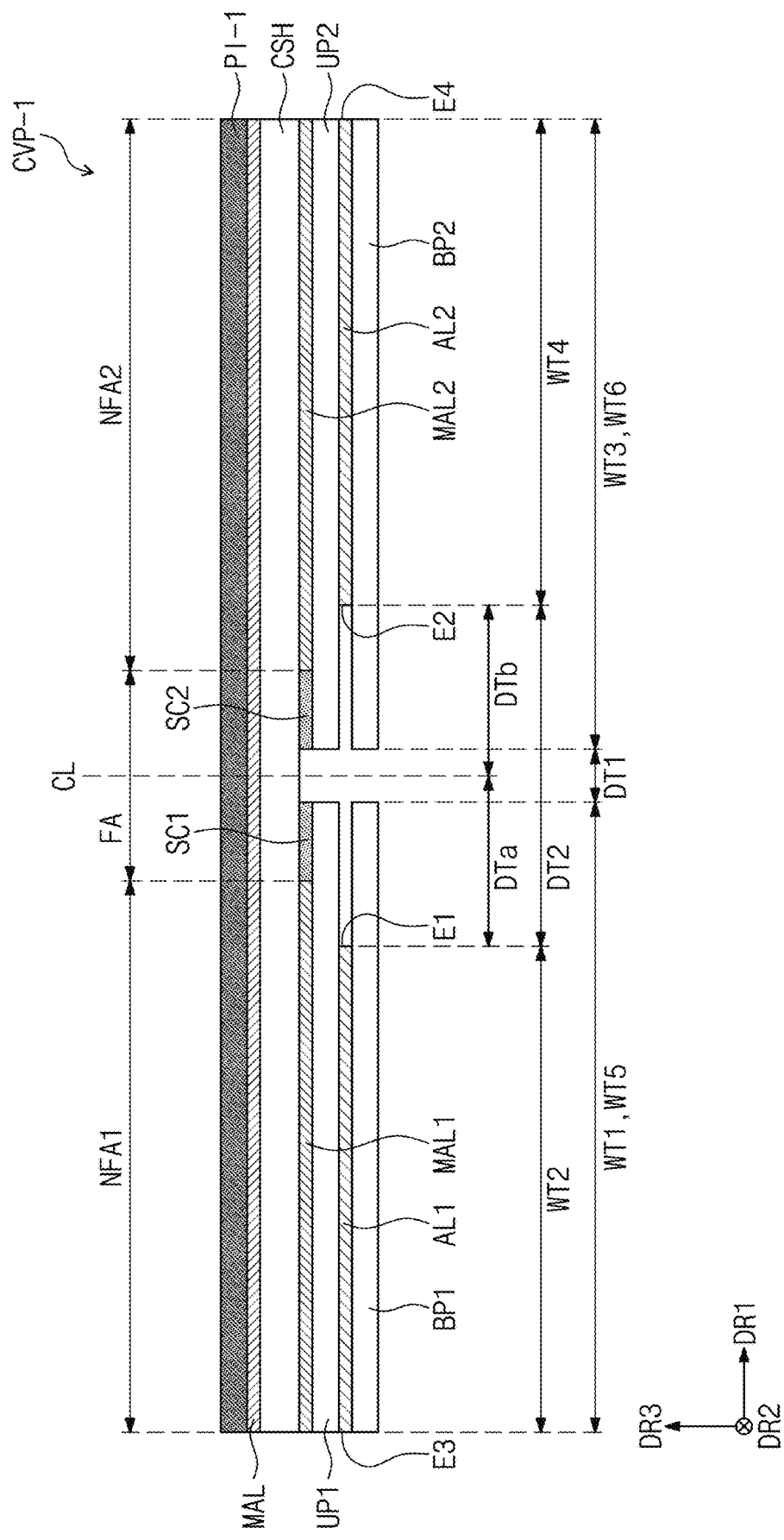
FIG. 12 is a cross-sectional view illustrating a cover member according to an alternative embodiment of the invention.

FIG. 12 is a cross-sectional view illustrating a cover member according to an alternative embodiment of the invention. In describing an embodiment shown in FIG. 12, a different component from that in FIG. 7 will hereinafter be described for convenience of description, and the same or like components as those described above with reference to FIG. 7 will be designated by the same reference symbol and any repetitive detailed description thereof will be omitted.

Referring to FIG. 12, a protection layer PI-1 of a cover member CVP-1 may be a colored film having a predetermined color. In one embodiment, for example, the colored film may be a film having a predetermined color. The color may be a color having a high light absorptance, i.e., a color having a low light transmittance. In one embodiment, for example, the color may be a gray color.

Figure 13:
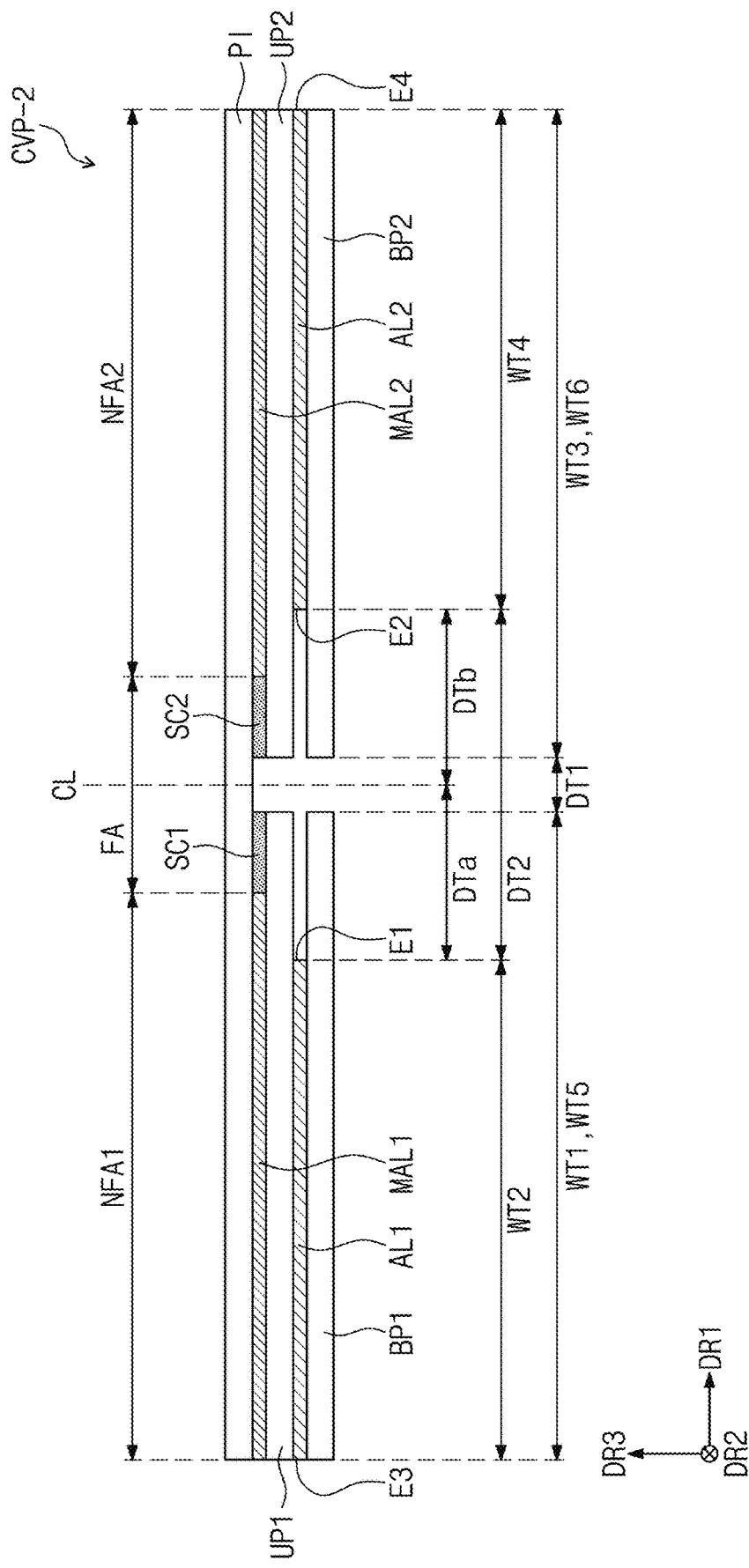
FIG. 13 is a cross-sectional view illustrating a cover member according to another alternative embodiment of the invention.

FIG. 13 is a cross-sectional view illustrating a cover member according to another alternative embodiment of the invention. In describing an embodiment shown in FIG. 13, a different component from that in FIG. 7 will hereinafter be described for convenience of description, and the same or like components as those described above with reference to FIG. 7 will be designated by the same reference symbol and any repetitive detailed description thereof will be omitted.

Referring to FIG. 13, a cover member CVP-2 may not include the cushion layer CSH and the intermediate adhesive layer MAL shown in FIG. 7. Thus, a thinner display device may be provided.

Figure 14:
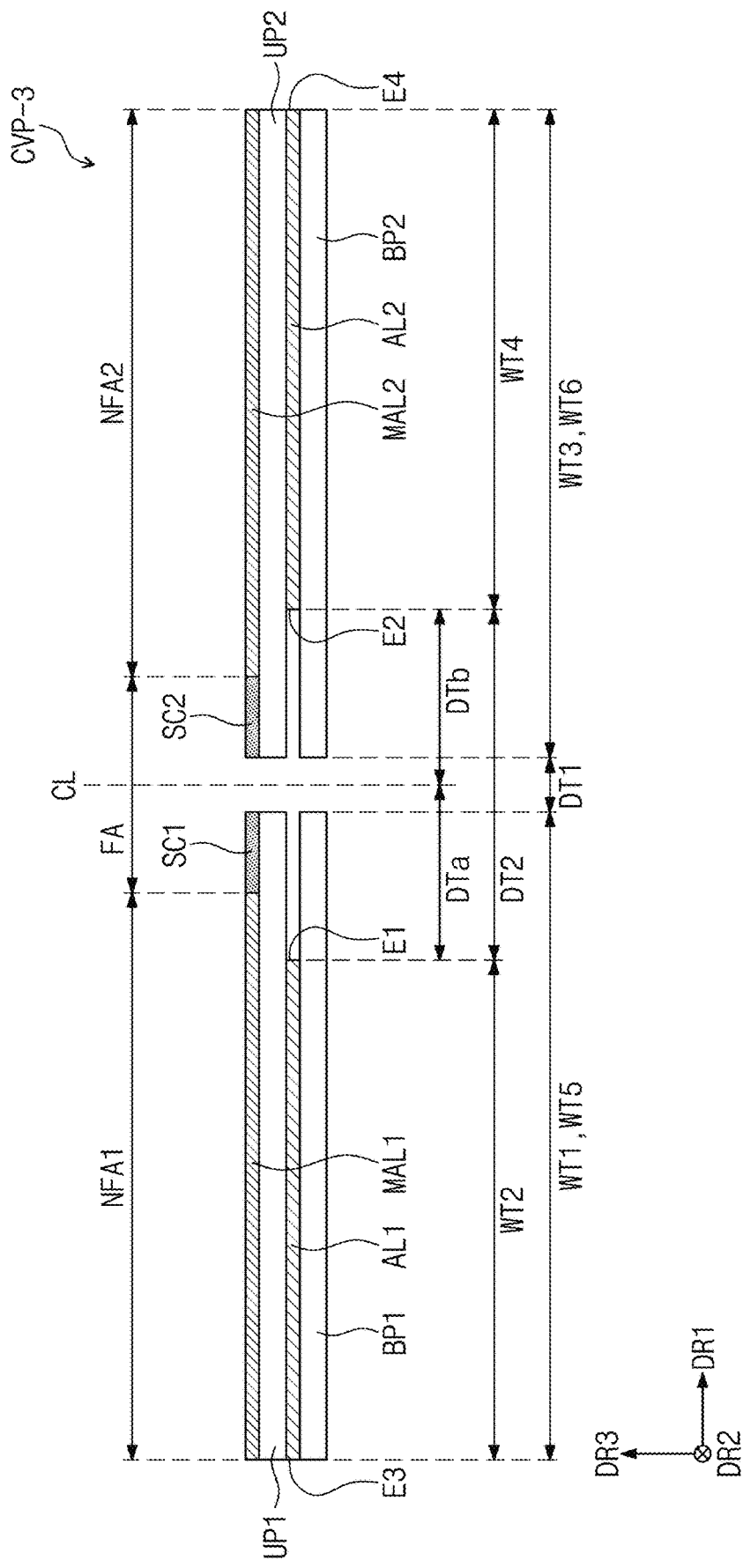
FIG. 14 is a cross-sectional view illustrating a cover member according to another alternative embodiment of the invention.

FIG. 14 is a cross-sectional view illustrating a cover member according to another alternative embodiment of the invention. In describing the embodiment of FIG. 14, a different component from that in FIG. 7 will hereinafter be described for convenience of description, and the same or like components as those described in FIG. 7 will be designated by the same reference symbol and any repetitive detailed description thereof will be omitted.

Referring to FIG. 14, a cover member CVP-3 may not include the protection layer PI, the cushion layer CSH and the intermediate adhesive layer MA L shown in FIG. 7. Thus, the first intermediate adhesive layer MAL1 and the second intermediate adhesive layer MAL2 may be attached directly to the rear surface of the display module DM (refer to FIG. 3). In such an embodiment, the adhesive layer AL in FIG. 3 may be omitted. Thus, a display device including the cover member CVP-3 may have a smaller thickness.

Figure 15:
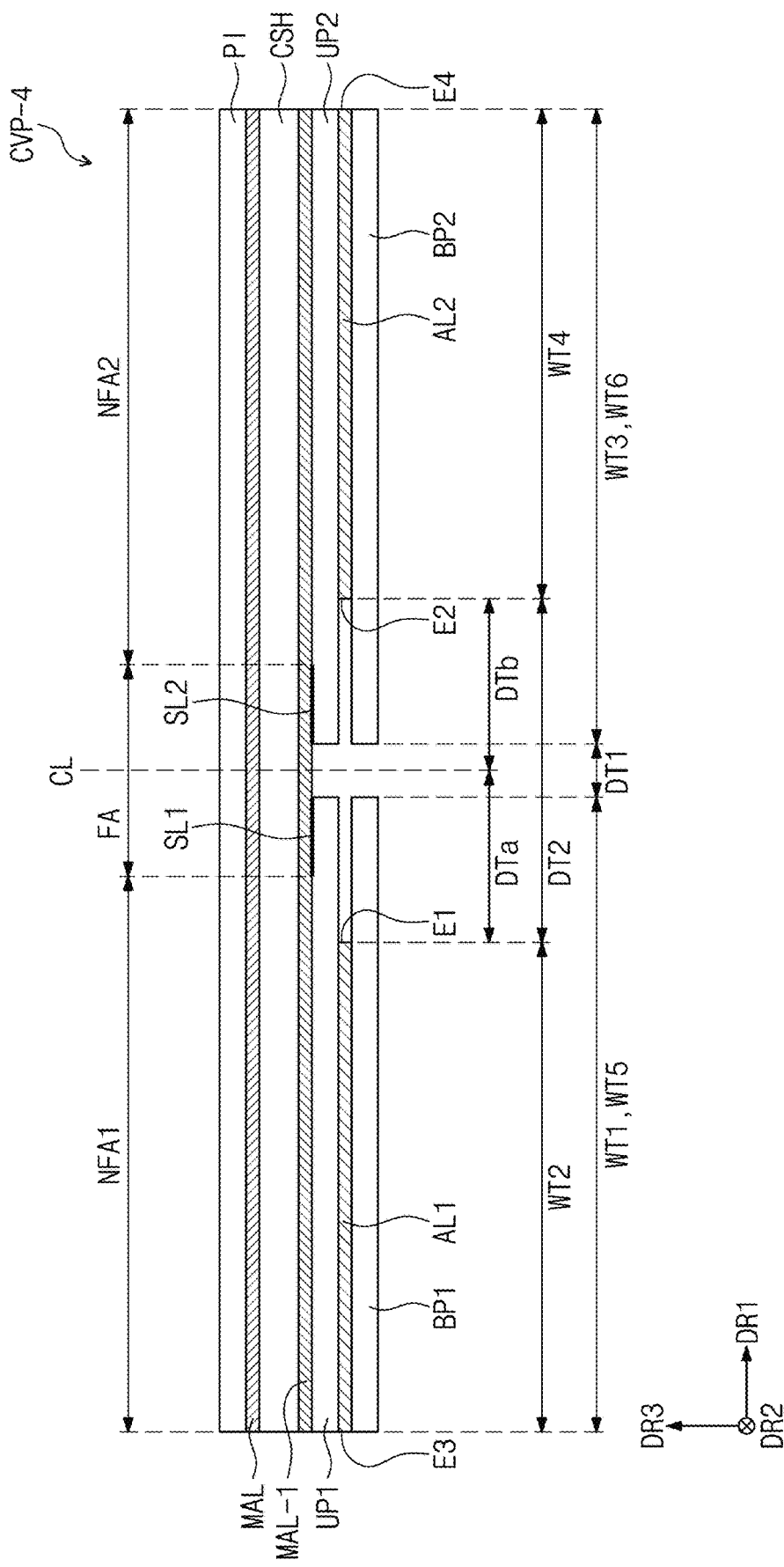
FIG. 15 is a cross-sectional view illustrating a cover member according to another alternative embodiment of the invention.

FIG. 15 is a cross-sectional view illustrating a cover member according to another alternative embodiment of the invention. In describing the embodiment of FIG. 15, a different component from that in FIG. 7 will hereinafter be described for convenience of description, the same or like components as those described in FIG. 7 will be designated by the same reference symbol and any repetitive detailed description thereof will be omitted.

Referring to FIG. 15, in an embodiment, a cover member CVP-4 may not include the first intermediate adhesive layer MAL1, the second intermediate adhesive layer MAL2, the first step compensation layer SC1, and the second step compensation layer SC2 shown in FIG. 7. In such an embodiment, an intermediate adhesive layer MAL-1 may be provided between the cushion layer CSH and the first upper plate UP1 and between the cushion layer CSH and the second upper plate UP2. The intermediate adhesive layer MAL-1 may be attached to an entire rear surface of the cushion layer CSH.

The first upper plate UP1 may be attached to a portion of the intermediate adhesive layer MAL-1, which overlaps the first non-folding area NFA1, and the second upper plate UP2 may be attached to a portion of the intermediate adhesive layer MAL-1, which overlaps the second non-folding area NFA2. A portion of the first upper plate UP1, which overlaps the folding area FA, and a portion of the second upper plate UP2, which overlaps the folding area FA, may not be attached to the intermediate adhesive layer MAL-1.

A coating layer SL1 may be provided to (or disposed on) the portion of the first upper plate UP1, and a coating layer SL2 may be provided to the portion of the second upper plate UP2. Each of the coating layers SL1 and SL2 may include fluorine. In an embodiment of the invention, a portion of the intermediate adhesive layer MAL-1 may be reduced in adhesive force by irradiating ultraviolet rays to the intermediate adhesive layer MAL-1 overlapping the folding area FA.

In embodiments of the invention, as set forth herein, the deformation of the display module may be reduced, such that the visibility degree of the curved deformation may be reduced, and the product reliability of the display device may improve.

Although some exemplary embodiments of the invention have been described, it is understood that the invention should not be limited to these exemplary embodiments but various changes and modifications can be made by one ordinary skilled in the art within the spirit and scope of the invention as hereinafter claimed. Hence, the real protective scope of the invention shall be determined by the technical scope of the accompanying claims.

What is claimed is:

1. A display device comprising:
a display module; and
a cover member disposed below the display module,
wherein the cover member comprises:
   a first upper plate disposed below the display module;
   a second upper plate disposed below the display module and spaced a first distance apart from the first upper plate in a first direction;
   a first attachment layer attached to a bottom surface of the first upper plate;
   a second attachment layer attached to a bottom surface of the second upper plate and spaced a second distance, which is greater than the first distance, apart from the first attachment layer in the first direction;
   a first lower plate attached to a bottom surface of the first attachment layer; and
   a second lower plate attached to a bottom surface of the second attachment layer.

2. The display device of claim 1, wherein the second distance is in a range from about 10 mm to about 34 mm.

3. The display device of claim 1, wherein
the display module comprises a first non-folding area, a folding area and a second non-folding area, which are sequentially defined in the first direction, and
each of the first attachment layer and the second attachment layer does not overlap the folding area on a plane.

4. The display device of claim 3, wherein
a first end of the first attachment layer overlaps the first non-folding area while being spaced apart from a boundary between the first non-folding area and the folding area on the plane, and
a second end of the second attachment layer overlaps the second non-folding area while being spaced apart from a boundary between the second non-folding area and the folding area on the plane.

5. The display device of claim 3, wherein the cover member comprises:
   a first intermediate adhesive layer disposed between the display module and the first upper plate, and attached to the first upper plate;
   a first step compensation layer disposed between the display module and the first upper plate;
   a second intermediate adhesive layer disposed between the display module and the second upper plate, and attached to the second upper plate; and
   a second step compensation layer disposed between the display module and the second upper plate.

6. The display device of claim 5, wherein
both opposing surfaces of each of the first intermediate adhesive layer and the second intermediate adhesive layer have an adhesive force, and
each of the first step compensation layer and the second step compensation layer has a surface having an adhesive force less than an adhesive force of an opposing surface thereof.

7. The display device of claim 5, wherein
the first intermediate adhesive layer overlaps the first non-folding area on the plane,
the second intermediate adhesive layer overlaps the second non-folding area on the plane, and
each of the first step compensation layer and the second step compensation layer overlaps the folding area on the plane.

8. The display device of claim 5, wherein
the first intermediate adhesive layer has a width in the first direction, which is greater than a width of the first attachment layer in the first direction, and
the second intermediate adhesive layer has a width in the first direction, which is greater than a width of the second attachment layer in the first direction.

9. The display device of claim 5, wherein the cover member further comprises:
   a protection layer disposed below the display module; and
   a cushion layer disposed below the protection layer,
   wherein the first intermediate adhesive layer is attached to the cushion layer, and
   the second intermediate adhesive layer is attached to the cushion layer.

10. The display device of claim 1, wherein
the display module comprises a first non-folding area, a folding area and a second non-folding area, which are sequentially defined in the first direction, and
the cover member further comprises an intermediate adhesive layer disposed between the display module and the first upper plate and between the display module and the second upper plate, and
the first upper plate is attached to the intermediate adhesive layer in an area overlapping the first non-folding area on a plane,
the second upper plate is attached to the intermediate adhesive layer in an area overlapping the second non-folding area on the plane, and
the first upper plate and the second upper plate do not adhere to the intermediate adhesive layer in an area overlapping the folding area on the plane.

11. The display device of claim 1, wherein each of the first attachment layer and the second attachment layer is a pressure sensitive adhesive.

12. The display device of claim 1, wherein each of the first upper plate, the second upper plate, the first lower plate and the second lower plate is a metal plate.

13. The display device of claim 1, wherein
the first upper plate has a first width in the first direction, which is greater than a second width of the first attachment layer in the first direction, and the second upper plate has a third width in the first direction, which is greater than a fourth width of the second attachment layer in the first direction.

14. The display device of claim 13, wherein
the first lower plate has a fifth width in the first direction, which is the same as the first width, and
the second lower plate has a sixth width in the first direction, which is the same as the third width.

15. A display device comprising:
a display module comprising a first non-folding area, a folding area, and a second non-folding area, which are sequentially defined in a first direction; and
a cover member disposed below the display module,
wherein the cover member comprises:
   a first upper plate disposed below the first non-folding area;
   a second upper plate disposed below the second non-folding area;
   a first lower plate disposed below the first upper plate;
   a second lower plate disposed below the second upper plate;
   a first attachment layer disposed between the first upper plate and the first lower plate; and
   a second attachment layer disposed between the second upper plate and the second lower plate,
   wherein
   the first upper plate has a width in the first direction, which is greater than a width of the first attachment layer in the first direction, and
   the second upper plate has a width in the first direction, which is greater than a width of the second attachment layer in the first direction.

16. The display device of claim 15, wherein
a center in the first direction is defined in the folding area,
a distance from the center to a first end of the first attachment layer is in a range from about 5 mm to about 17 mm, and
a distance from the center to a second end of the second attachment layer is in the range from about 5 mm to about 17 mm.

17. The display device of claim 16, wherein
the width of the first attachment layer in the first direction is a distance from the first end of the first attachment layer to a third end, which is disposed opposite to the first end, of the first attachment layer, and
the third end overlaps an end of the first upper plate on a plane.

18. The display device of claim 15, wherein each of the first attachment layer and the second attachment layer is a pressure sensitive adhesive.

19. The display device of claim 15, wherein the cover member further comprises:
   a first intermediate adhesive layer disposed between the display module and the first upper plate while being attached to the first upper plate;
   a first step compensation layer disposed between the display module and the first upper plate;
   a second intermediate adhesive layer disposed between the display module and the second upper plate while being attached to the second upper plate; and
   a second step compensation layer disposed between the display module and the second upper plate,
   wherein
   the first intermediate adhesive layer overlaps the first non-folding area on a plane,
   the second intermediate adhesive layer overlaps the second non-folding area on the plane, and
   each of the first step compensation layer and the second step compensation layer overlaps the folding area on the plane.

20. The display device of claim 19, wherein
both opposing surfaces of each of the first intermediate adhesive layer and the second intermediate adhesive layer has an adhesive force, and
each of the first step compensation layer and the second step compensation layer has a surface having an adhesive force less than an adhesive force of an opposing surface thereof.

* * * * *